United States Patent
Murakami

(12) 
(10) Patent No.: US 6,658,074 B1
(45) Date of Patent: Dec. 2, 2003

(54) METHOD AND APPARATUS FOR REPRODUCING CLOCK SIGNAL OF LOW ORDER GROUP SIGNAL

(75) Inventor: Kurenai Murakami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/577,074

(22) Filed: May 23, 2000

(30) Foreign Application Priority Data

May 28, 1999 (JP) .......................................... 11-150119

(51) Int. Cl.[7] .......................... H04L 7/00; H04L 25/36; H04L 25/40
(52) U.S. Cl. ...................... 375/372; 375/363; 370/505
(58) Field of Search ............................... 375/372, 354, 375/359, 363; 370/505, 504

(56) References Cited

U.S. PATENT DOCUMENTS

| | | | | |
|---|---|---|---|---|
| 3,742,142 A | * | 6/1973 | Clark et al. ................. | 370/505 |
| 4,259,738 A | * | 3/1981 | Liskov et al. ............... | 370/506 |
| 5,119,406 A | * | 6/1992 | Kramer ....................... | 375/372 |
| 5,434,890 A | * | 7/1995 | Kimura et al. .............. | 375/305 |
| 6,246,668 B1 | * | 6/2001 | Kusyk ........................ | 370/228 |

FOREIGN PATENT DOCUMENTS

| | | |
|---|---|---|
| JP | 63-9697 | 3/1988 |
| JP | 5-153078 | 6/1993 |
| JP | 8-181678 | 7/1996 |
| JP | 9-505705 | 6/1997 |
| JP | 2697371 | 9/1997 |

OTHER PUBLICATIONS

Kohhei Ohtake, "Jitter Characteristics in Multiplexing–Demultiplexing System Using Pulse Stuffing Synchronization", Electronics and Communications in Japan, vol. 58–A, No. 8, 1975, PP 46–54.*

D.L. Duttweiler, "Waiting Time Jitter", The Bell Technical Journal, vol. 51, No. 1, Jan. 1972, pp. 165–207.

Makoto Yamashita, "Simple Digital Data Transmission", The Telecommunications Association in Japan, vol. 4, Jun. 26, 1998, pp. 82–85.

* cited by examiner

*Primary Examiner*—Mohammad H. Ghayour
(74) *Attorney, Agent, or Firm*—Sughrue Mion, PLLC

(57) ABSTRACT

In a clock signal reproducing circuit in a pulse stuffed synchronizing system, a destuffing circuit removes stuff pulses and unnecessary bits from a higher order group signal to output a lower order group signal, and outputs stuff data indicating existence or non-existence of positive stuff or negative stuff in the higher order group signal. A storage circuit stores the lower order group signal outputted from the destuffing circuit. A stuff rate determining circuit determines a stuff rate from a difference between the number of positive stuffs and the number of negative stuffs to a stuffing possible period of the higher order group signal based on the stuff data outputted from the destuffing circuit. A variable frequency divider frequency-divides a clock signal of the higher order group signal based on the control signal outputted from the control circuit. A phase synchronization oscillation circuit reproduces a clock signal of the lower order group signal based on the frequency-divided clock signal outputted from the variable frequency divider.

36 Claims, 18 Drawing Sheets

METHOD AND APPARATUS FOR REPRODUCING CLOCK SIGNAL OF LOW ORDER GROUP SIGNAL

BACKGROUND OF THE INVENTION

1. Field of the Invention

The present invention relates to a technique for reproducing a clock signal for a lower order group signal at a receiver side in a pulse stuffed synchronizing system.

2. Description of Related Art

In a conventional digital data transmission system, a transmitter converts digital signals into their high-speed digital signal form by time-division multiplexing and a receiver receives and demultiplexes the multiplexed signal to reproduce the original digital signals. The original digital signals to be multiplexed are however supplied from various devices and may not be matched in the clock rate without subjecting to a particular process. For matching or synchronizing the signals, a net synchronizing method or a stuffed synchronizing method may preferably be used.

The stuffed synchronizing method is not designed to directly synchronize the digital signals received from various devices. The stuffed synchronizing method stores the signals to be multiplexed in a memory and then reads out them by use of a common clock signal which is slightly faster than that of the digital signals to align the signals in the timing. A difference between the digital signal and the clock signal is compensated by inserting an extra number of pulses (referred to as stuffed pulses). It is thus needed at the receiver side to identify the position of stuffed pulses for removing the extra pulses.

More specifically, the pulse stuffed synchronizing system is depicted in "Simple Digital Data Transmission" by Makoto Yamashita et al, the Telecommunications Association in Japan, Ver. 4, Jun. 26, 1998. In this reference, there is a case where a clock signal for a lower order group signal and a clock signal for a higher order group signal are not synchronous with each other. At this time, extra pulses are inserted (stuffed) into the lower order group signal at the transmitter side to synchronize the clock signal for the lower order group signal and the clock signal for the higher order group signal. At the receiver side in the pulse stuffed synchronizing system, the extra or stuffed pulses are removed (de-stuffed) and then the clock signal for the lower order group signal is reproduced by a phase synchronization oscillating circuit.

Also, the pulse stuffed synchronizing system is described explicitly in "Waiting Time Jitter" by D. L. Duttweiler (The Bell System Technical Journal, Vol. 51, No. 1, January 1972). In this reference, it is described that the stuffed pulses can not fully be removed at the receiver side hence causing jitters.

Particularly, in a conventional pulse stuffed synchronizing method utilized with SONET (synchronous optical network) or SDH (synchronous digital hierarchy) in an advanced digital communication system, the extra pulses are inserted and removed on a byte-by-byte basis. As a result, a greater amplitude of jitter is generated.

A procedure of synchronously multiplexing existing DS3 signals under the SONET standard will now be described. FIGS. 17 to 19 are diagrams showing a frame structure of an STS-1 signal, a frame structure of an STS-1 SPE signal and a byte structure of data signal, respectively.

The SONET specifications are defined in ANSI T1.105-1995 (Synchronous optical network-Basic description including multiplex structure, rates, and formats) and ANSI T1.105.02-1995 (Synchronous optical network-Payload mappings) of the American National Standards Institute. In the standards, the DS3 signal having a nominal bit repetitive frequency of 44.736 Mb/s is accommodated in the STS-1 (synchronous transport signal level 1) signal having a nominal bit repetitive frequency of 51.84 Mb/s. The STS-1 signal is the higher order group signal while the DS3 signal is the lower order group signal. As shown in FIG. 17, the STS-1 signal has a capacity of 810 bytes, 90 bytes in horizontal by 9 rows in vertical and accommodates a single STS-1 SPE (synchronous payload envelope) signal. In the STS-1 signal, the STS-1 SPE is accommodated in the region of a frame other than the overhead region without considering the stuffed pulses and its region is 783 bytes per frame.

Also, the STS-1 signal frame and the STS-1 SPE frame are not always matched relative to each other. As shown in FIG. 17, one frame of the STS-1 SPE signal may be accommodated in two frames of the STS-1 signal. In other words, the head location of the STS-1 SPE signal may be varied in the frame of the STS-1 signal. The head location of the STS-1 SPE signal in the STS-1 signal frame is indicated with pointers H1 and H2 which are accommodated in the overhead region of the STS-1 signal frame.

The STS-1 signal and the STS-1 SPE signal are not always synchronized with each other. For this reason, the STS-1 signal includes positive/zero/negative stuff data in units of bytes. The existence or non-existence of the stuffed pulses is also indicated with the pointers H1 and H2. More specifically, the existence or non-existence of the stuffed pulses is indicated by inverting of specific bits of the pointers H1 and H2.

Also, there is a pointer operation H3. When the positive stuffing is made, one byte of stuffed pulses is inserted after the pointer operation H3. In case of the negative stuffing, STS-1 SPE data is accommodated in one byte of the pointer operation H3. The zero stuffing means that neither the positive stuffing nor negative stuffing is made. In case of the zero stuffing, the stuffed pulses are inserted in one byte of the pointer operation H3 represents and STS-1 SPE data is accommodated in one byte after the pointer operation H3.

As shown in FIGS. 18 and 19, the frame of the STS-1 SPE signal is composed of 783 bytes, 87 bytes in horizontal by 9 rows in vertical, and accommodates a DS3 signal. Since the STS-1 SPE signal and the DS3 signal are not synchronous with each other, the positive stuffing is defined in units of bits. The region of the STS-1 SPE signal where the DS3 signal is accommodated is represented by a combination of stuffed bits s and data bits i regardless of the positive stuffing, and 622 bits per row. The bit s indicates the positive stuffing location where the data of the DS3 signal is usually stored while the stuffed pulses are stored only in a positive stuffing mode. The existence or non-existence of the positive stuffing is indicated by converting all the stuff control bits c to 1. It should be noted that in FIG. 19, o indicates an overhead bit and r indicates a fixed stuff bit which is a type of overhead bit.

When the DS3 signal is accommodated in the STS-1 signal, there are carried out two stages of the stuffing processes, i.e., the positive/zero/negative stuffing process in units of bytes in the STS-1 signal and the positive stuffing process in units of bits in the STS-1 SPE signal. As described previously, the positive/zero/negative stuffing process in units of bytes in the STS-1 signal may generate a greater amplitude of jitter. It is hence crucial to remove such jitter.

For the purpose, an apparatus and a method for mapping and removing jitter are disclosed in Japanese Patent Laid Open Patent Application (JP-A-Heisei 9-505705) as shown by a circuit arrangement of FIG. 1. FIG. 1 is a block diagram showing the structure of a receiving unit (a de-synchronizer) for reproducing the inserted signals including asynchronous data from a high transmission rate synchronization signal in a predetermined clock rate.

Referring to FIG. 1, a first de-stuffing circuit 1 detects the positive/zero/negative stuffing in a received STS-1 signal and carries out the de-stuffing process to remove unnecessary bits such as of the overhead of the STS-1 signal. Thus, the first de-stuffing circuit 1 extract an STS-1 SPE signal 68. Then, a second de-stuffing circuit 12 detects the positive stuffing in the STS-1 SPE signal and carries out the de-stuffing operation to remove unnecessary bits such as the overhead of the STS-1 SPE signal. Thus, the second de-stuffing circuit 12 extract a DS3 signal.

A stuff bit leak circuit 15 produces a data indicating that byte based stuff data 64 of the STS-1 signal detected by the first de-stuffing circuit and bit based stuff data 65 of the STS-1 SPE signal detected by the second de-stuffing circuit are dispersed into bits to remove the stuffed pulses. Then, the circuit 15 outputs the data as a stuff bits leak data 73. Similarly, an overhead delete data generating circuit 16 produces a data indicating that data indicating the number of bytes of the overhead removed by the first and second de-stuffing circuits and data indicating the number of bytes of the unused bits are dispersed in unit of bits and removed. Then, the overhead delete data generating circuit 16 outputs the produced data as overhead delete data 74. Only the DS3 signal extracted from the STS-1 SPE signal is stored in a storage circuit 2 which in turn detects a quantity of stored data and outputs data storage quantity data 75.

First, second and third digital/analog converter circuits 17, 18 and 19 modulates into pulse modulated signals, the stuff bit leak data 73 from the stuff bits leak circuit 15, the overhead delete data 74 from the overhead delete data generating circuit 16, and the data storage quantity data 75 from the storage circuit 2, respectively. An adder circuit 20 adds the three outputs of the first, second 18 and third digital/analog converter circuits 17, 18 and 19. An output of the adder circuit 20 is passed through a low pass filter circuit 603 and fed to a voltage controlled oscillator circuit 604 to control the oscillation clock signal frequency. A clock output 58 outputted from the voltage controlled oscillator circuit 604 is synchronous with the clock signal of the extracted DS3 signal and can be used to read the DS3 signal from the storage circuit 2.

In this manner, the circuit shown in FIG. 17 processes data such that the stuffed pulses are dispersed and removed in units of bits. Thus, variations in the controlled voltage from the voltage controlled oscillator circuit due to the removal of the stuffed pulses is restrained to reduce the generation of jitter.

Also, a stuff multiplexing receiver circuit shown in FIG. 12 is disclosed in Japanese Patent No. 2,697,371. This reference solves the problem that a difference in frequency between a write clock signal and the read clock signal becomes greater when a large number of bits having no data exist in a single frame. In this case, if the frequency difference is large, the drop of pulses from the clock signal which is to be supplied to a PLL circuit is increased so that the amplitude of jitter can be too large. As a result, the PLL circuit can not restrain the jitter. More particularly, the clock signal generated from a transmission line data is divided in frequency into units of frame periods. Also, the clock signal from the voltage controlled oscillator circuit in the PLL is variably divided in frequency into in units of frame periods depending on the existence or non-existence of the stuffed pulses. The two frame periods are then compared to each other in the phase by a phase comparator. The difference between the two frame periods is fed back. In this way, the effect of bits carrying no information in the frame may be avoided.

Next, the stuff multiplexing receiver circuit disclosed in the Japanese Patent No. 2,697,371 will now be described in more detail referring to FIG. 2. The circuit shown in FIG. 2 includes a first and second de-stuffing circuit 1 and 12, as shown in the circuit shown in FIG. 17 and extracts an STS-1 SPE signal 68 and a DS3 signal 52 respectively. The extracted DS3 signal 52 is then stored in a storage circuit 2.

A frame pulse generating circuit 21 divides in frequency the clock signal frequency of the STS-1 signal to produce pluses of each frame cycle of the STS-1 signal. A variable frequency dividing circuit 606 divides a clock output 652 outputted from a voltage controlled oscillator circuit 604 by L which is the number of bits of the DS3 signal accommodated in one frame of the STS-1 signal. It would be apparent that L is a natural number. The number of bits L of the DS3 signal may be varied from one frame to another. For this reason, a variable frequency dividing circuit controlling section 14 calculates L from the stuff data from the first de-stuffing circuit 1 and the second de-stuffing circuit 12 and controls the frequency division ratio of the variable frequency dividing circuit 606.

A phase comparing circuit 601 compares the pulses of each frame cycle of the STS-1 signal received from the frame pulse generating circuit 21 with a clock signal 653 outputted from the variable frequency dividing circuit 606 in phase. The phase comparing circuit 601 transmits the comparing result to a voltage controlled oscillator circuit 604 via an amplifier circuit 602 and a low pass filter circuit 603 to control the oscillation clock signal frequency. The phase comparing circuit 601, the amplifier circuit 602, the low pass filter circuit 603, the voltage controlled oscillator circuit 604, and the variable frequency dividing circuit 606 constitute a phase synchronization oscillator circuit 9 with the frequency division ratio variable. The circuit of the Japanese Patent No. 2,697,371 shown in FIG. 2 carries out the phase comparison in each frame of the STS-1 signal independently of the removal of stuffed pulses, thereby to minimize the effect of jitter caused due to the stuffed pulses.

However, there are the following problems in the apparatus and method for mapping and removing jitter and shown in FIG. 17 and disclosed in the Japanese Laid Open Patent Application (JP-A-Heisei 9-505705).

That is, the oscillation frequency of the voltage controlled oscillator circuit 604 shown in FIG. 17 is determined based on the stuffed bits leak data 73, the overhead delete data 74, and the data storage quantity data 75. For handling the three different types of the data, the circuit arrangement has to be bulky in the size. Also, because the overhead is not related directly to the stuffed pulses, the clock signal can be preferably reproduced without use of the overhead delete data 74. In this respect, the circuit shown in FIG. 17 shall be modified for improvement.

There are the following problems in the stuff multiplex transmitter/receiver circuit of the patent No. 2,697.371 shown in FIG. 18. The number of bits of the DS3 signal in one frame of the STS-1 signal is substantially 5592 in average. Accordingly, when the frequency division ratio L of the phase synchronization oscillator circuit 9 is as high as 5592, the voltage controlled oscillator circuit 604 will fail to restrain the effect of phase noise intrinsic to its circuit, resulting in deterioration of the quality of a reproduced clock signal.

It is desired that the frequency division ratio of the phase synchronization oscillator circuit is not higher than 100. Otherwise, the stuff multiplex transmitter/receiver circuit shown in FIG. 2 is disadvantageous in permitting the reproduced clock signal to have more phase noises.

In conjunction with the above description, a monitoring system of a PCM multiplexing apparatus is disclosed in Japanese Examined Patent Application (JP-B-Showa 63-9697). In this reference, the PCM multiplexing apparatus uses a stuff synchronization system. A stuff rate monitoring circuit is provided for each of channel sections which carries out a stuffing operation to a group of lower order signals to be multiplexed. The stuff rate monitoring circuit monitors whether the stuff rate of the lower order stuffed signals falls within a predetermined range.

Also, a destuffing circuit is disclosed in Japanese Laid Open Patent Application (JP-A-Heisei 5-153078). In this destuffing circuit, a signal from a transmission path is converted using a master clock signal provided in the apparatus such that a frame structure is realized of stuff bit inserting positions which are not continuous and are periodical in a constant interval. Moreover, the number of times of the insertion of the stuff bits is averaged. A signal after a re-stuffing operation is supplied to a conventional PLL circuit using a voltage controlled oscillator. Thus, a lower order group signal is smoothed so as to suppress output jitter. In this way, the output jitter of the lower order group signal can be restrained when the stuff bits exist continuously for a few to a few tens of bits in a digital stuff multiplex mode.

Also, a destuff synchronization circuit is disclosed in Japanese Laid Open Patent Application (JP-A-Heisei 8-181678). In this reference, a clock signal CK which is subjected to a destuff control is frequency-divided by first ½ frequency divider to 1/N frequency divider. Then, a signal WC is selected from the frequency-divided signals by a first selector (31) such that the signal WC does not have a relation of an integer ratio to an inserting bit period of an auxiliary signal which is inserted in a high order group signal S1. An output signal of a voltage controlled oscillator (7) which has the same frequency as the clock signal CK is frequency-divided by second frequency dividers (32 to 34). Then, a signal RC is selected from the frequency-divided signals by a second selector (35) such that the signal RC has the same frequency division ratio as the signal WC. A phase difference between the signal WC and the signal RC is detected by a phase comparator (5) and outputted to an oscillator (7) via a low pass filter (6).

SUMMARY OF THE INVENTION

Therefore, an object of the present invention is to provide a clock signal reproducing circuit of a lower order group signal in a pulse stuffed synchronizing system.

Another object of the present invention is to provide a clock signal reproducing circuit of a lower order group signal, in which the effect of jitter can be restrained, even when a large number of stuffed pulses have been inserted.

Still another object of the present invention is to provide a clock signal reproducing circuit of a lower order group signal, in which the phase synchronization oscillator circuit has a small frequency division ratio.

Yet still another object of the present invention is to provide a clock signal reproducing circuit of a lower order group signal, which has a relatively small circuit size.

In order to achieve an aspect of the present invention, a clock signal reproducing circuit in a pulse stuffed synchronizing system which reproduces a lower order group signal from a higher order group signal, includes a destuffing circuit, a storage circuit, a stuff rate determining circuit, a control circuit, a variable frequency divider and a phase synchronization oscillation circuit. The destuffing circuit removes stuff pulses and unnecessary bits from the higher order group signal to output the lower order group signal, and outputs stuff data indicating existence or non-existence of positive stuff or negative stuff in the higher order group signal. The lower order group signal is accommodated in the higher order group signal by inserting the stuff pulses in the lower order group signal. The storage circuit stores the lower order group signal outputted from the destuffing circuit. The stuff rate determining circuit determines a stuff rate from a difference between the number of positive stuffs and the number of negative stuffs to a stuffing possible period of the higher order group signal based on the stuff data outputted from the destuffing circuit. The control circuit outputs a control signal indicating a frequency division ratio based on the stuff rate. The variable frequency divider frequency-divides a clock signal of the higher order group signal based on the control signal outputted from the control circuit. The phase synchronization oscillation circuit reproduces a clock signal of the lower order group signal based on the frequency-divided clock signal outputted from the variable frequency divider. The lower order group signal is read out from the storage circuit in response to the reproduced clock signal of the lower order group signal.

The phase synchronization oscillation circuit multiplies a frequency of the frequency-divided clock signal outputted from the variable frequency divider by N (N is a predetermined positive integer) to reproduce the clock signal of the lower order group signal, when a frequency division ratio of the phase synchronization oscillation circuit is N.

Also, the clock signal reproducing circuit may further includes a separating circuit separates a specific lower order group signal accommodated in the higher order group signal; and an additional frequency divider frequency-divides the clock signal of the higher order group signal. The separated lower order group signal outputted from the separating circuit is supplied to the destuffing circuit, and the frequency-divided clock signal from the additional variable frequency divider is supplied to the variable frequency divider.

Also, the clock signal reproducing circuit may further includes a separating circuit separating a specific lower order group signal accommodated in the higher order group signal. The separated lower order group signal outputted from the separating circuit is supplied to the destuffing circuit.

Also, the control circuit includes a calculating circuit which carries out a calculation based on the stuff rate; a summing circuit summing an output of the calculating circuit for every frequency division period; and a determining circuit determining whether or not an output of the summing circuit is equal to or larger than a predetermined value.

Also, the stuff rate determining circuit includes: a shift register circuit which stores the stuff data in order; a summation calculating circuit which calculates a summation of input data and an output of the shift register circuit; and a multiplying circuit which multiplies an output of the summation calculating circuit by a predetermined value.

Also, the storage circuit includes a storage element, a write address counter, a read address counter and an address control circuit. The storage element stores a signal. The write address counter is driven in response to a write clock signal, and generates a write address to specify a position of the storage element in which an input signal is written. The read address counter is driven in response to a read clock signal and generates a read address to specify a position of the storage element from which an output signal is read out. The address control circuit prevents a writing operation and a reading operation to a same position of the storage element from being carried out at a same time. In this case, the address control circuit controls at least one of the write address counter and the read address counter such that the write address and the read address are apart from each other, when the write address and the read address becomes near to a limit. Also, the address control circuit controls at least one of the write address counter and the read address counter such that the write address and the read address are apart from each other at an initial setting.

In order to achieve another aspect of the present invention, a clock signal reproducing circuit in a pulse stuffed synchronizing system which reproduces a lower order group signal from a higher order group signal, includes a destuffing circuit, a storage circuit, a stuff rate determining circuit, a control circuit, a variable frequency divider and a phase synchronization oscillation circuit. The destuffing circuit removes stuff pulses and unnecessary bits from the higher order group signal to output the lower order group signal, and outputs stuff data indicating existence or non-existence of positive stuff or negative stuff in the higher order group signal. The lower order group signal is accommodated in the higher order group signal by inserting the stuff pulses in the lower order group signal. The storage circuit stores the lower order group signal outputted from the destuffing circuit. The stuff rate determining circuit determines a stuff rate from a difference between the number of positive stuffs and the number of negative stuffs to a stuffing possible period of the higher order group signal based on the stuff data outputted from the destuffing circuit. The control circuit outputs a control signal indicating a frequency division ratio based on the stuff rate. The frequency divider frequency-divides a clock signal of the higher order group signal in a predetermined frequency division ratio. The phase synchronization oscillation circuit frequency-divides the frequency-divided clock signal outputted from the variable frequency divider based on the control signal outputted from the control circuit, to reproduce a clock signal of the lower order group signal. The lower order group signal is read out from the storage circuit in response to the reproduced clock signal of the lower order group signal.

The phase synchronization oscillation circuit multiplies a frequency of the frequency-divided clock signal outputted from the variable frequency divider by N (N is a predetermined positive integer) to reproduce the clock signal of the lower order group signal, when a frequency division ratio of the phase synchronization oscillation circuit is N.

Also, the clock signal reproducing circuit may further includes a separating circuit separates a specific lower order group signal accommodated in the higher order group signal; and an additional frequency divider frequency-divides the clock signal of the higher order group signal. The separated lower order group signal outputted from the separating circuit is supplied to the destuffing circuit, and the frequency-divided clock signal from the additional variable frequency divider is supplied to the variable frequency divider.

Also, the clock signal reproducing circuit may further includes a separating circuit separating a specific lower order group signal accommodated in the higher order group signal. The separated lower order group signal outputted from the separating circuit is supplied to the destuffing circuit.

Also, the control circuit includes a calculating circuit which carries out a calculation based on the stuff rate; a summing circuit summing an output of the calculating circuit for every frequency division period; and a determining circuit determining whether or not an output of the summing circuit is equal to or larger than a predetermined value.

Also, the stuff rate determining circuit includes: a shift register circuit which stores the stuff data in order; a summation calculating circuit which calculates a summation of input data and an output of the shift register circuit; and a multiplying circuit which multiplies an output of the summation calculating circuit by a predetermined value.

Also, the storage circuit includes a storage element, a write address counter, a read address counter and an address control circuit. The storage element stores a signal. The write address counter is driven in response to a write clock signal, and generates a write address to specify a position of the storage element in which an input signal is written. The read address counter is driven in response to a read clock signal and generates a read address to specify a position of the storage element from which an output signal is read out. The address control circuit prevents a writing operation and a reading operation to a same position of the storage element from being carried out at a same time. In this case, the address control circuit controls at least one of the write address counter and the read address counter such that the write address and the read address are apart from each other, when the write address and the read address becomes near to a limit. Also, the address control circuit controls at least one of the write address counter and the read address counter such that the write address and the read address are apart from each other at an initial setting.

In order to achieve still another aspect of the present invention, a clock signal reproducing circuit in a pulse stuffed synchronizing system which reproduces a lower order group signal from a higher order group signal, includes a destuffing circuit, a storage circuit, a stuff rate determining circuit, a first control circuit, a second control circuit, a variable frequency divider and a phase synchronization oscillation circuit. The destuffing circuit removes stuff pulses and unnecessary bits from the higher order group signal to output the lower order group signal, and outputs stuff data indicating existence or non-existence of positive stuff or negative stuff in the higher order group signal. The lower order group signal is accommodated in the higher order group signal by inserting the stuff pulses in the lower order group signal. The storage circuit stores the lower order group signal outputted from the destuffing circuit. The stuff rate determining circuit determines a stuff rate from a difference between the number of positive stuffs and the number of negative stuffs to a stuffing possible period of the higher order group signal based on the stuff data outputted from the destuffing circuit. The first control circuit outputs a first control signal indicating a first frequency division ratio based on the stuff rate. The second control circuit outputs a second control signal indicating a predetermined second frequency division ratio. The variable frequency divider frequency-dividing a clock signal of the higher order group signal based on the first control signal from the first control circuit. The phase synchronization oscillation circuit frequency-divides the frequency-divided clock signal outputted from the variable frequency divider based on the second control signal outputted from the second control circuit, to reproduce a clock signal of the lower order group signal. The lower order group signal is read out from the storage circuit in response to the reproduced clock signal of the lower order group signal.

The phase synchronization oscillation circuit multiplies a frequency of the frequency-divided clock signal outputted from the variable frequency divider by N (N is a predetermined positive integer) to reproduce the clock signal of the lower order group signal, when a frequency division ratio of the phase synchronization oscillation circuit is N.

Also, the clock signal reproducing circuit may further includes a separating circuit separates a specific lower order group signal accommodated in the higher order group signal; and an additional frequency divider frequency-divides the clock signal of the higher order group signal. The separated lower order group signal outputted from the separating circuit is supplied to the destuffing circuit, and the frequency-divided clock signal from the additional variable frequency divider is supplied to the variable frequency divider.

Also, the clock signal reproducing circuit may further includes a separating circuit separating a specific lower order group signal accommodated in the higher order group signal. The separated lower order group signal outputted from the separating circuit is supplied to the destuffing circuit.

Also, the control circuit includes a calculating circuit which carries out a calculation based on the stuff rate; a summing circuit summing an output of the calculating circuit for every frequency division period; and a determining circuit determining whether or not an output of the summing circuit is equal to or larger than a predetermined value.

Also, the stuff rate determining circuit includes: a shift register circuit which stores the stuff data in order; a summation calculating circuit which calculates a summation of input data and an output of the shift register circuit; and a multiplying circuit which multiplies an output of the summation calculating circuit by a predetermined value.

Also, the storage circuit includes a storage element, a write address counter, a read address counter and an address control circuit. The storage element stores a signal. The write address counter is driven in response to a write clock signal, and generates a write address to specify a position of the storage element in which an input signal is written. The read address counter is driven in response to a read clock signal and generates a read address to specify a position of the storage element from which an output signal is read out. The address control circuit prevents a writing operation and a reading operation to a same position of the storage element from being carried out at a same time. In this case, the address control circuit controls at least one of the write address counter and the read address counter such that the write address and the read address are apart from each other, when the write address and the read address becomes near to a limit. Also, the address control circuit controls at least one of the write address counter and the read address counter such that the write address and the read address are apart from each other at an initial setting.

In order to achieve yet still another aspect of the present invention, a clock signal reproducing circuit in a pulse stuffed synchronizing system which reproduces a lower order group signal from a higher order group signal, includes a destuffing circuit, a storage circuit, a stuff rate determining circuit, a first control circuit, a second control circuit, a variable frequency divider and a phase synchronization oscillation circuit. The destuffing circuit removes stuff pulses and unnecessary bits from the higher order group signal to output the lower order group signal, and outputs stuff data indicating existence or non-existence of positive stuff or negative stuff in the higher order group signal. The lower order group signal is accommodated in the higher order group signal by inserting the stuff pulses in the lower order group signal. The storage circuit stores the lower order group signal outputted from the destuffing circuit. The stuff rate determining circuit determines a stuff rate from a difference between the number of positive stuffs and the number of negative stuffs to a stuffing possible period of the higher order group signal based on the stuff data outputted from the destuffing circuit. The first control circuit outputs a first control signal indicating a predetermined first frequency division ratio. The second control circuit outputs a second control signal indicating a second frequency division ratio based on the stuff rate. The variable frequency divider frequency-divides a clock signal of the higher order group signal based on the first control signal from the first control circuit. The phase synchronization oscillation circuit frequency-divides the frequency-divided clock signal outputted from the variable frequency divider based on the second control signal outputted from the second control circuit, to reproduce a clock signal of the lower order group signal. The lower order group signal is read out from the storage circuit in response to the reproduced clock signal of the lower order group signal.

The phase synchronization oscillation circuit multiplies a frequency of the frequency-divided clock signal outputted from the variable frequency divider by N (N is a predetermined positive integer) to reproduce the clock signal of the lower order group signal, when a frequency division ratio of the phase synchronization oscillation circuit is N.

Also, the clock signal reproducing circuit may further includes a separating circuit separates a specific lower order group signal accommodated in the higher order group signal; and an additional frequency divider frequency-divides the clock signal of the higher order group signal. The separated lower order group signal outputted from the separating circuit is supplied to the destuffing circuit, and the frequency-divided clock signal from the additional variable frequency divider is supplied to the variable frequency divider.

Also, the clock signal reproducing circuit may further includes a separating circuit separating a specific lower order group signal accommodated in the higher order group signal. The separated lower order group signal outputted from the separating circuit is supplied to the destuffing circuit.

Also, the control circuit includes a calculating circuit which carries out a calculation based on the stuff rate; a summing circuit summing an output of the calculating circuit for every frequency division period; and a determining circuit determining whether or not an output of the summing circuit is equal to or larger than a predetermined value.

Also, the stuff rate determining circuit includes: a shift register circuit which stores the stuff data in order; a summation calculating circuit which calculates a summation of input data and an output of the shift register circuit; and a multiplying circuit which multiplies an output of the summation calculating circuit by a predetermined value.

Also, the storage circuit includes a storage element, a write address counter, a read address counter and an address control circuit. The storage element stores a signal. The write address counter is driven in response to a write clock signal, and generates a write address to specify a position of the storage element in which an input signal is written. The read address counter is driven in response to a read clock signal and generates a read address to specify a position of the storage element from which an output signal is read out. The address control circuit prevents a writing operation and a reading operation to a same position of the storage element from being carried out at a same time. In this case, the address control circuit controls at least one of the write address counter and the read address counter such that the write address and the read address are apart from each other, when the write address and the read address becomes near to a limit. Also, the address control circuit controls at least one of the write address counter and the read address counter such that the write address and the read address are apart from each other at an initial setting.

DESCRIPTION OF THE PREFERRED EMBODIMENTS

Hereinafter, the clock signal reproducing circuit for a lower order group signal of the present invention will be described with reference to the attached drawings.

Figure 3:
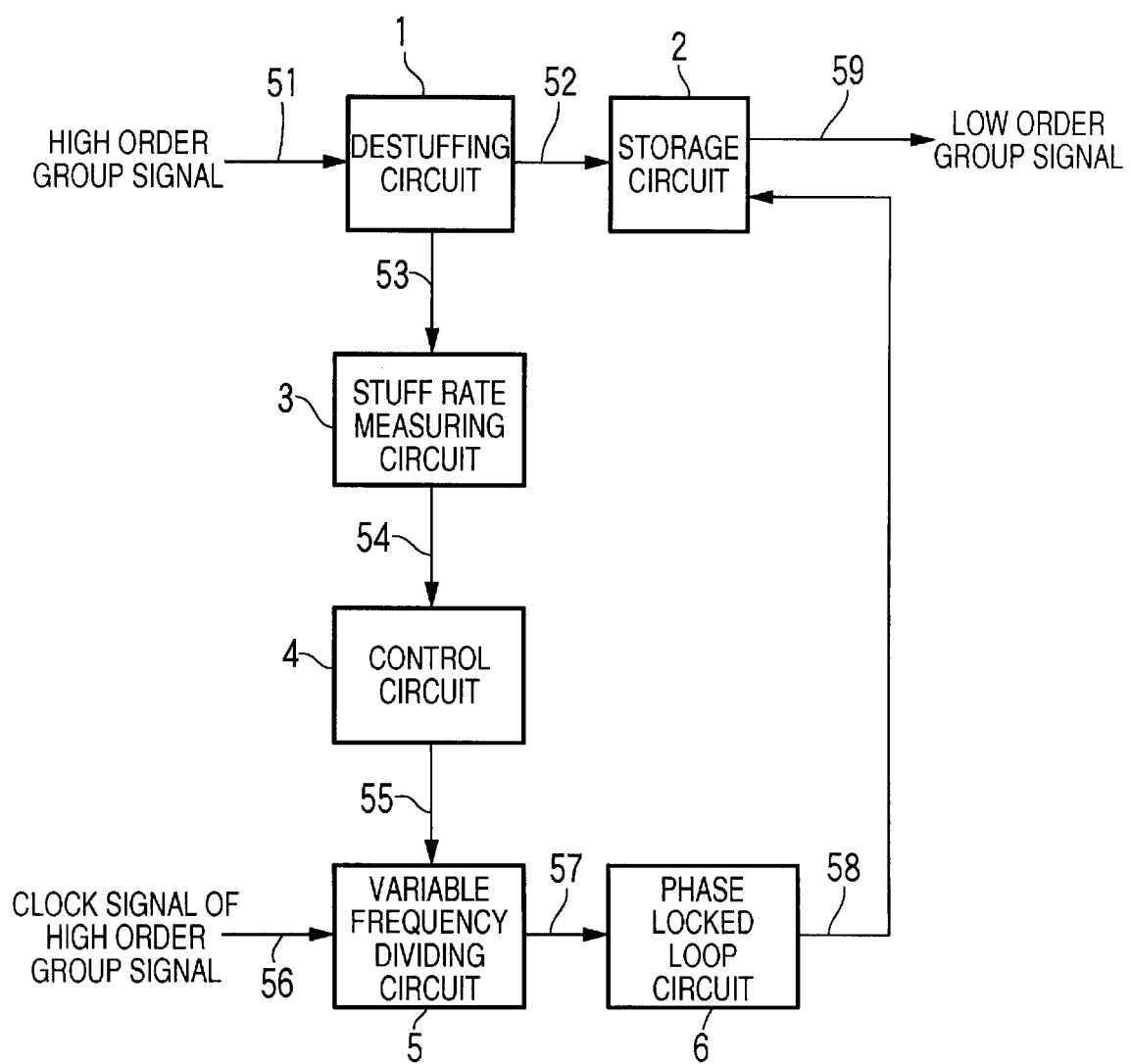
FIG. 3 is a block diagram showing the structure of a clock signal reproducing circuit according to a first embodiment of the present invention.

FIG. 3 is a block diagram showing the structure of the clock signal reproducing circuit according to the first embodiment of the present invention. Referring to FIG. 3, the clock signal reproducing circuit is composed of a destuffing circuit 1, a storage circuit 2, a stuff rate measuring circuit 3, a control circuit 4, a variable frequency dividing circuit 5, and a phase locked loop circuit 6.

The de-stuffing circuit 1 carries out a de-stuffing operation to a higher order group signal 51 to delete unwanted bits and extracts a lower order group signal 52 which is then stored in a storage circuit 2. Also, the de-stuffing circuit 1 detects a stuff data 53 through the stuffing operation and supplies the detected stuff data 53 to a stuff rate measuring circuit 3. The stuff rate measuring circuit 3 calculates a stuff rate 54 from the stuff data 53 received from the de-stuffing circuit 1. The stuff rate data 54 calculated by the stuffing rate measuring circuit 3 is transmitted to a control circuit 4. The control circuit 4 generates the variable frequency division control signal 55 based on the stuff rate data 54. A variable frequency dividing circuit 5 carries out a frequency division of M1 or M2 to a clock signal 56 of the higher order group signal in accordance with a variable frequency division control signal 55. A phase synchronization oscillator circuit 6 generates or reproduces a clock signal 58 from a clock signal 57 outputted from the variable frequency dividing circuit 5. The reproduced clock signal 58 has the frequency N (N is a natural number) times greater than the frequency of the clock signal 57. The clock signal 58 reproduced from the phase synchronization oscillator circuit 6 is the reproduced clock signal for the lower order group signal and is used as a read clock to the storage circuit 2.

Figure 8:
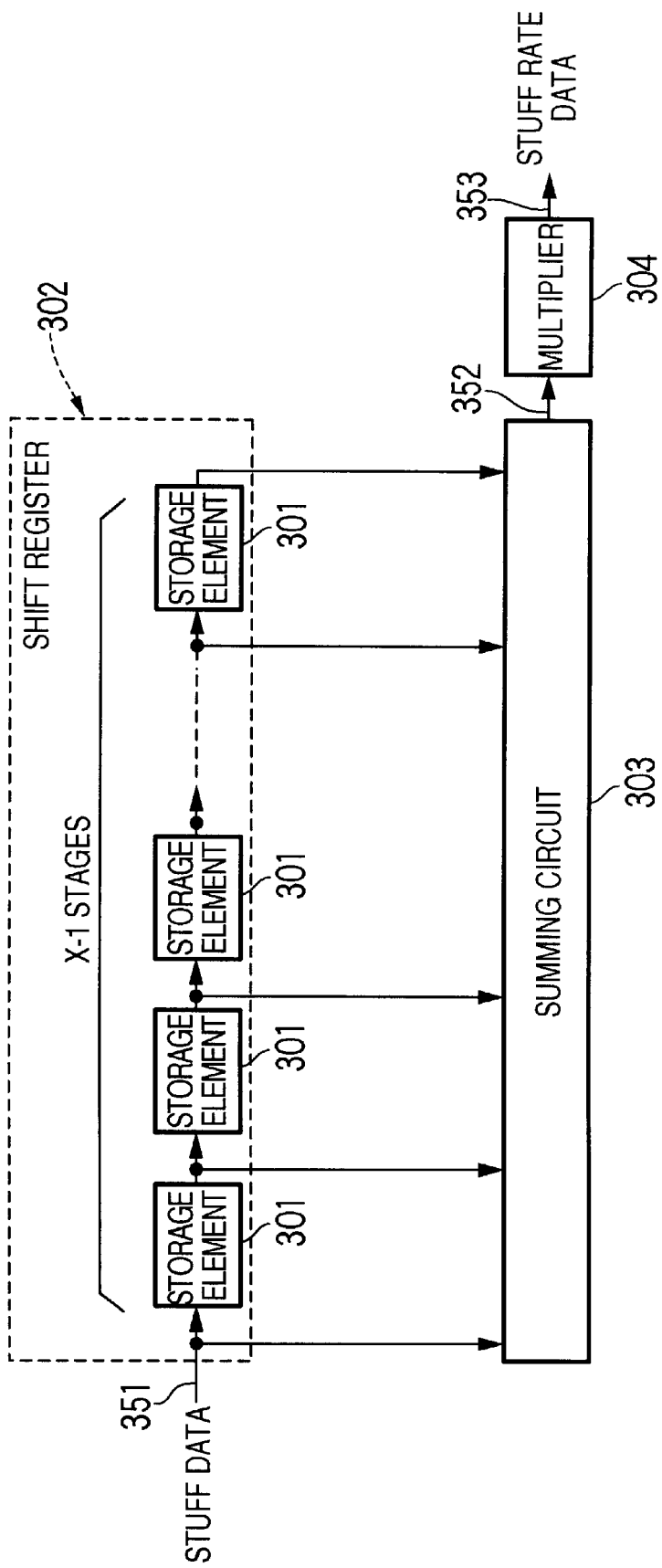
FIG. 8 is a block diagram showing the structure of an example of a stuff rate measuring circuit of the clock signal reproducing circuit in the first embodiment.

FIG. 8 is a block diagram of an example of the stuff rate measuring circuit 3 shown in FIG. 3. As shown in FIG. 8, an input signal 351 is the stuff data 53 outputted from the de-stuffing circuit 1. The input signal 351 is +1, when the positive stuffing is made, is 0 when the zero stuffing is made, i.e., no stuffing is made, and −1 when the negative stuffing is made.

A series of storage elements 301 form an (X−1)-stage shift register 302 where the storage content is shifted up at each of stuffing enable periods of the higher order group signal. The stuffing enable period means a period between positions in which the stuffing operation is carried out. For example, if a single position where the stuffing operation is carried out is present in one frame of the higher order group signal, the stuffing enable period is equal to one period of the higher order group signal frame. A summing circuit 303 calculates a sum of outputs of the storage elements 301. A multiplier circuit 304 multiplies an output 352 of the summing circuit 303 by 1/X, where X is the number of input signals to the summing circuit 303. Thus, an output 353 of the multiplier circuit 304 is the stuffing rate data 54 shown in FIG. 3. The circuit shown in FIG. 8 is a known finite impulse response type digital filter and may be replaced by another appropriate circuit whose characteristics are alike. Also, an infinite impulse response type digital filter whose characteristics are similar to those of the circuit shown in FIG. 8 may be used with same success.

Figure 9:
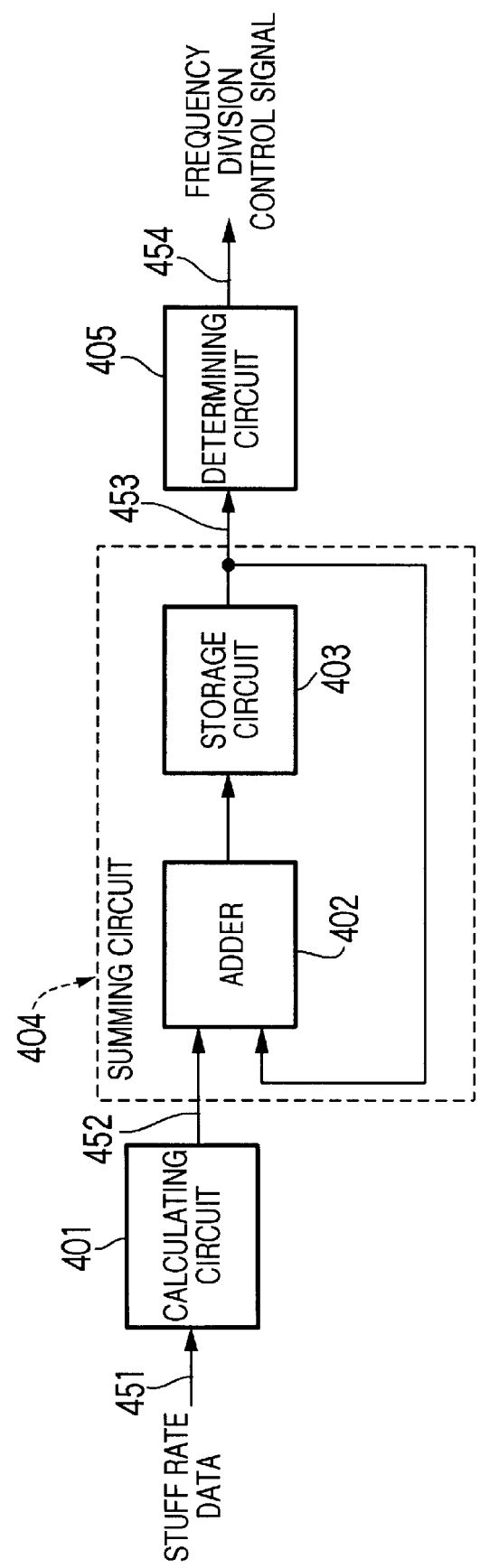
FIG. 9 is a block diagram showing the structure of an example of a variable frequency dividing circuit controlling section of the clock signal reproducing circuit in the first embodiment.

FIG. 9 is a block diagram of an example of the control circuit 4 for variable frequency dividing circuit 5 shown in FIG. 3. As shown in FIG. 9, a calculating circuit 401 calculates the output 452 which is to be supplied to the summing circuit 404 based on the stuff rate data 451. An adder circuit 402 and a storage circuit 403 form a summing circuit 404 where an output 452 of a calculating circuit 401 is repeatedly added at each of the frequency division periods in the variable frequency dividing circuit 5. A determining circuit 405 determines whether a summation result 453 of the summing circuit 404 is not lower than "1". When the summation result is not lower than "1", the determining circuit 405 outputs "1". If the summation result is lower than "1", the determining circuit 405 outputs "0" An output 454 of the determining circuit 405 is the variable frequency division control signal 55 shown in FIG. 3.

Figure 10:
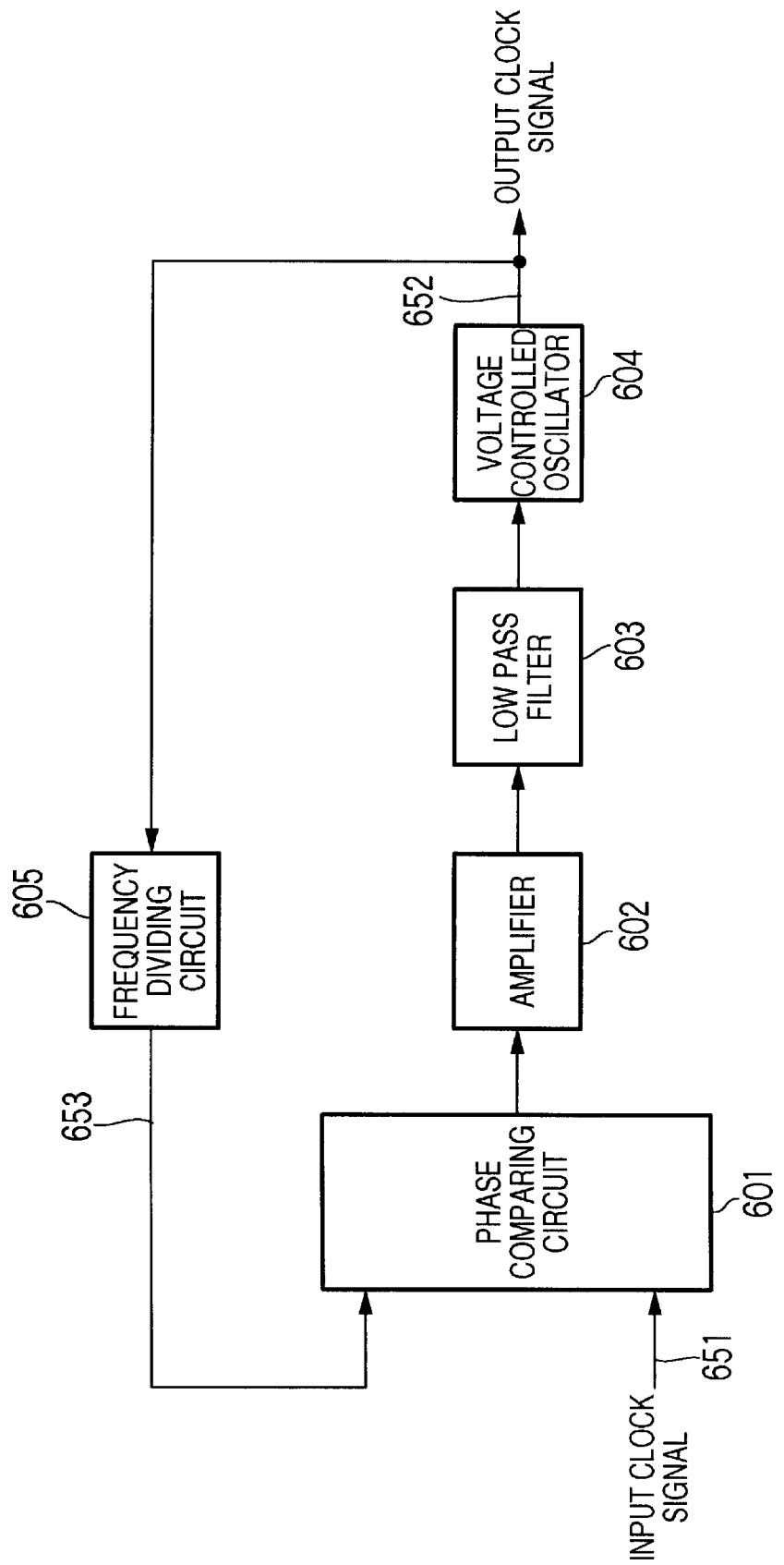
FIG. 10 is a block diagram showing the structure of an example of a phase synchronization oscillator circuit of the clock signal reproducing circuit in the first embodiment.

FIG. 10 is a block diagram showing an example of the phase synchronization oscillator (phase locked loop) circuit 6. As shown in FIG. 10, the output of a voltage controlled oscillator circuit 604 is divided in frequency by N by a frequency dividing circuit 605 and then compared in phase with a clock signal 651 by a phase comparing circuit 601. An output of the phase comparing circuit 601 is passed through an amplifier circuit 602 and a low pass filter circuit 603, and then is fed to the voltage controlled oscillator circuit 604 for controlling the oscillation frequency. In the phase synchronization oscillator circuit 6 shown in FIG. 10, the voltage controlled oscillator circuit 604 produces a clock signal whose frequency is N times greater than the frequency of the clock signal 651 and outputs as a clock signal 652. The phase synchronization oscillator circuit is known by those skilled in the art. In the present invention, it is sufficient that the frequency of the outputted clock signal is N times greater than that of the inputted clock signal, N being a natural number. The phase synchronization oscillator circuit may have any structure. Therefore, it will be described in no more detail.

Figure 11:
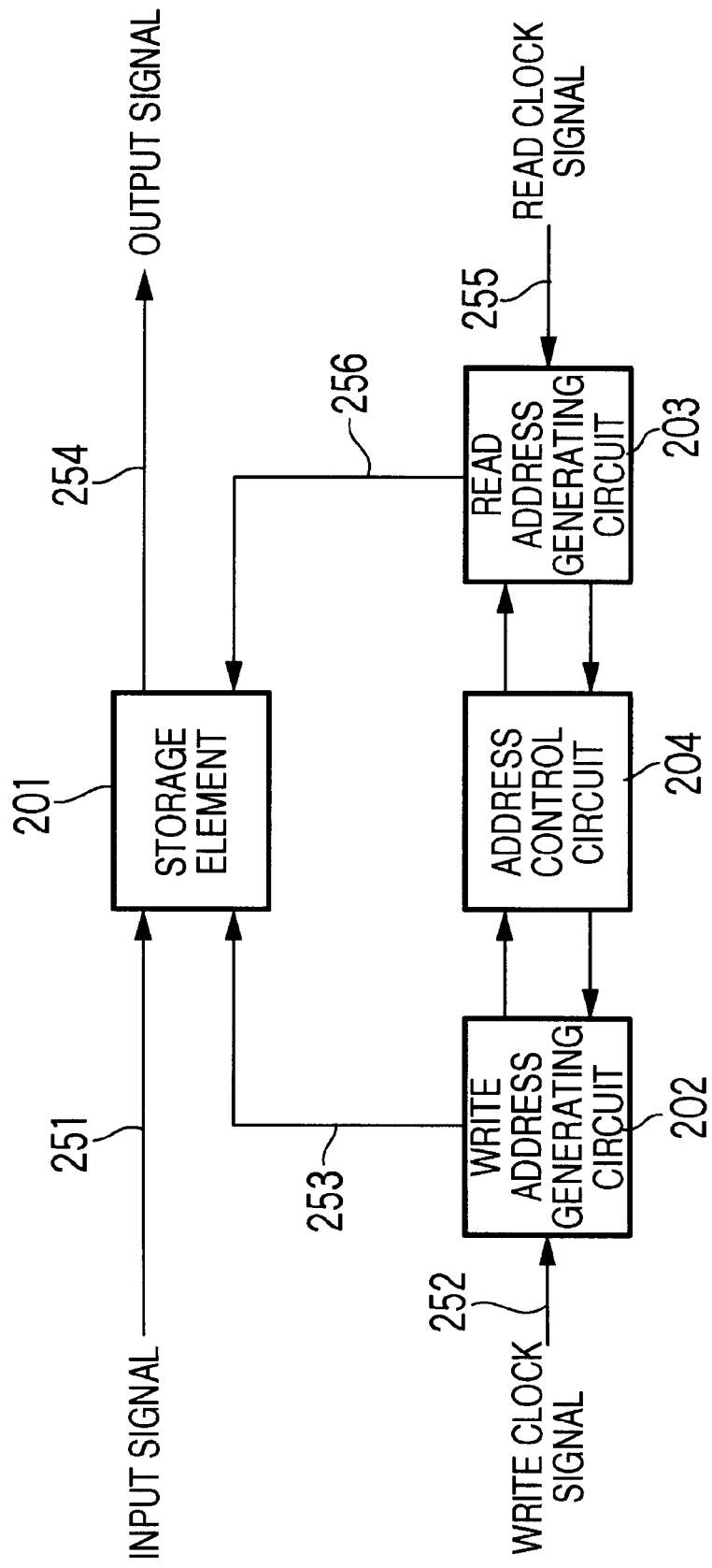
FIG. 11 is a block diagram showing the structure of an example of a storage circuit of the clock signal reproducing circuit in the first embodiment.

FIG. 11 is a block diagram of an example of the storage circuit 2 shown in FIG. 3. An input data signal 251 is stored in a location of a storage element 201 which is specified by a write address signal 253. The write address signal 253 is generated by a write address counter or write address generating circuit 202 which is controlled in accordance with a write clock signal 252. A read address counter or read address generating circuit 203 is controlled in accordance with a read clock signal 255 to generate a read address signal 256. The data signal 251 is read out from a location of the storage element 201 which is specified by the read address signal 256 and then is outputted as an output signal 254. An address control circuit 204 prevents an event known as slipping operation, in which a particular location of the storage element 201 is accessed for the writing operation and the reading operation simultaneously. When the write address 253 and the read address 256 come too close to each other to leave a smaller distance, the address control circuit 204 controls the write address counter 202 and/or the read address counter 203 to properly space the write address 253 and the read address 256 from each other. Also, the address control circuit 204 controls the write address counter 202 and/or the read address counter 203 at the initial setting such as the connection to power supply or the input of a first signal. As a result, the write address 253 and the read address 256 are properly spaced from each other. The arrangement of such a storage element is known by those skilled in the art. Therefore, it will be described in no more detail.

Next, the operation of the clock signal reproducing circuit in the first embodiment of the present invention shown in FIG. 3 will now be described in more detail.

The de-stuffing circuit 1 carries out the de-stuffing operation to the higher order group signal 51 to delete or remove unwanted bits and then to extract the lower order group signal 52. The lower order group signal 52 is stored in the storage circuit 2 while the stuff data 53 detected by the de-stuffing circuit 1 is transmitted to the stuff rate measuring circuit 3.

The operation of the stuff rate measuring circuit 3 having the arrangement shown in FIG. 8 will be described. It is supposed that the stuff rate is p/q. In this case, pp−pn=p is met, where q is the number of stuffing enable periods, pp is the number of times of the positive stuffing operations, and pn is the number of times of the negative stuffing operations. Also, the stuffed pulse detected in each stuffing enable period is "1" in case of the positive stuffing operation, 0 in case of the zero stuffing or no stuffing operation, and −1 in case of the negative stuffing operation. Then, the output 352 of the summing circuit 303 shown in FIG. 8 is p, when q=X at the stuff rate of p/q. Accordingly, the stuff rate can be obtained by multiplying the output 352 of the summing circuit 303 by 1/X by the multiplier circuit 304. X is the length of the shift register and also the divisor for determining the stuff rate. Hence, the accuracy of the calculation depends on X. When X is greater, the accuracy increases, but the circuitry arrangement becomes greater in the size. When X is smaller, the circuitry arrangement becomes smaller in the size but the accuracy will be decreased.

According to the present invention, the clock signal frequency for the lower order group signal is calculated from the stuff rate. Thus, the accuracy of the stuff rate largely governs the accuracy of the clock signal frequency for the lower order group signal. It is essential to selection an optimum value of X for obtaining the stuff rate of a higher accuracy in the stuff rate measuring circuit 3 shown in FIG. 8. Particularly, when the nominal stuff rate is 0, a higher level of the accuracy is required and X has to be as greater as possible.

It is supposed that the lower order group signal is accommodated in the high order signal through a single stage of the stuffing process. In this case, the stuff rate S is expressed as follows:

$$S=(Bl-Bh*Fl/Fh)/Bs$$

where Bh is the number of bits in one frame of the higher order group signal, Bl is the number of bits in the lower order group signal accommodated in one frame of the higher order group signal with no stuffing involved, Bs is the unit of bits when the stuffing operation is carried out, Fh is the clock signal frequency for the higher order group signal, and Fl is the clock signal frequency for the lower order group signal. Therefore, when the stuff rate S is given, the relation between the clock signal frequency for the higher order group signal and the clock signal frequency for the lower order group signal is expressed by the following equation (1):

$$Fl=Fh/\{Bh/(Bl-S*Bs)\} \tag{1}$$

The equation (1) shows that the clock signal frequency Fh for the higher order group signal and the clock signal frequency Fl for the lower order group signal are proportional to each other and its constant of proportion k is Bh/(Bl−S*Bs). When both sides of the equation (1) is divided by N, the following equation (2) is given:

$$Fl/N = Fh/\{Bh*N/(Bl-S*Bs)\} \quad (2)$$

Therefore, when the clock signal frequency for the lower order group signal is divided by N, a resultant quotient is equal to the clock signal frequency for the higher order group signal divided by Bh*N/(Bl−S*Bs). Because Bh, Bl, and Bs are known, Bh*N/(Bl−S*Bs) can be calculated using the stuff rate S. That is, if the clock signal frequency for the higher order group signal can be divided in frequency by Bh*N/(Bl−S*Bs), the clock signal for the lower order group signal can be reproduced by multiplying the frequency division resultant frequency by N by the phase synchronization oscillator circuit.

A usual frequency dividing circuit allows the frequency division by only a natural number. Because Bh*N/(Bl−S*Bs) is typically a real number, the usual frequency dividing circuit can not be used. However, when a variable frequency dividing circuit having a variable frequency division ratio is used, a frequency division ratio of a real number can be realized through averaging. For example, it is supposed that the variable frequency dividing circuit have the two different frequency division ratios of M1 and M2. Also, it is supposed that the ratio of frequency division ratio of M1 is R1 and the ratio of frequency division ratio of M2 is R2=1−R1. In this case, the average of the frequency division ratio is equal to R1*M1+R2*M2. Therefore, the clock signal frequency for the higher order group signal can equivalently be divided in frequency by Bh*N/(Bl−S*Bs), when R1 and R2 are determined so that the following equation (3) is met:

$$R1*M1+R2*M2 = Bh*N/(Bl-S*Bs) \quad (3)$$

The control circuit 4 of FIG. 3 shown in FIG. 9 operates as follows. That is, using R1=1−R2, the equation (3) is transformed to:

$$R2 = \{Bh*N/(Bl-S*Bs)-M1\}/(M2-M1) \quad (4)$$

Since Bh, Bl, and Bs are known and M1, M2, and N are predetermined, R2 can be calculated from the stuff rate S using the equation (4). The calculating circuit 401 shown in FIG. 9 calculates R2 from the stuff rate S using the equation 4 to output as the output 451.

The summing circuit 404 composed of the adder circuit 402 and the storage circuit 403 repeats to add the output 451 of the calculating circuit 401 at every period of the frequency division in the variable frequency dividing circuit 5. The determining circuit 405 determines whether the resultant output 453 of the summing circuit 404 is not lower than "1". When the resultant output 453 is equal to or higher than "1", the output of the determining circuit 405 is "1". When the resultant output 453 is lower than "1", the output of the determining circuit 405 is "0". The rate when the output 454 of the determining circuit 401 is "1" is R2. Accordingly, the output 454 of the determining circuit 405 shown in FIG. 9 is utilized as the variable frequency division control signal 55. That is, the variable frequency dividing circuit 5 uses the frequency division ratio of M1 in response to "0" of the variable frequency division control signal 55 and the frequency division ratio of M2 in response to "1" of the same.

Returning to FIG. 3, in the above case, the frequency of the clock signal 57 outputted from the variable frequency dividing circuit 5 becomes equal to 1/N the clock signal frequency for the lower order group signal. The phase synchronization oscillator circuit 6 generates a clock signal whose frequency is N times greater than the frequency of the clock signal 57 outputted from the variable frequency dividing circuit 5. Hence, the frequency of the clock signal 58 outputted from the phase synchronization oscillator circuit 6 is matched to that for the lower order group signal, allowing the reproduction of the clock signal for the lower order group signal. The reproduced clock signal for the lower order group signal is then used for reading out the lower order group signal 59 from the storage circuit 2.

The equations (1) to (4) are applicable when the lower order group signal is accommodated in the higher order group signal through a single state of the stuffing operation. The equations (1) to (4) are properly be modified when the lower order group signal is accommodated in the higher order group signal through two or more stages of the stuffing operation.

Figure 4:
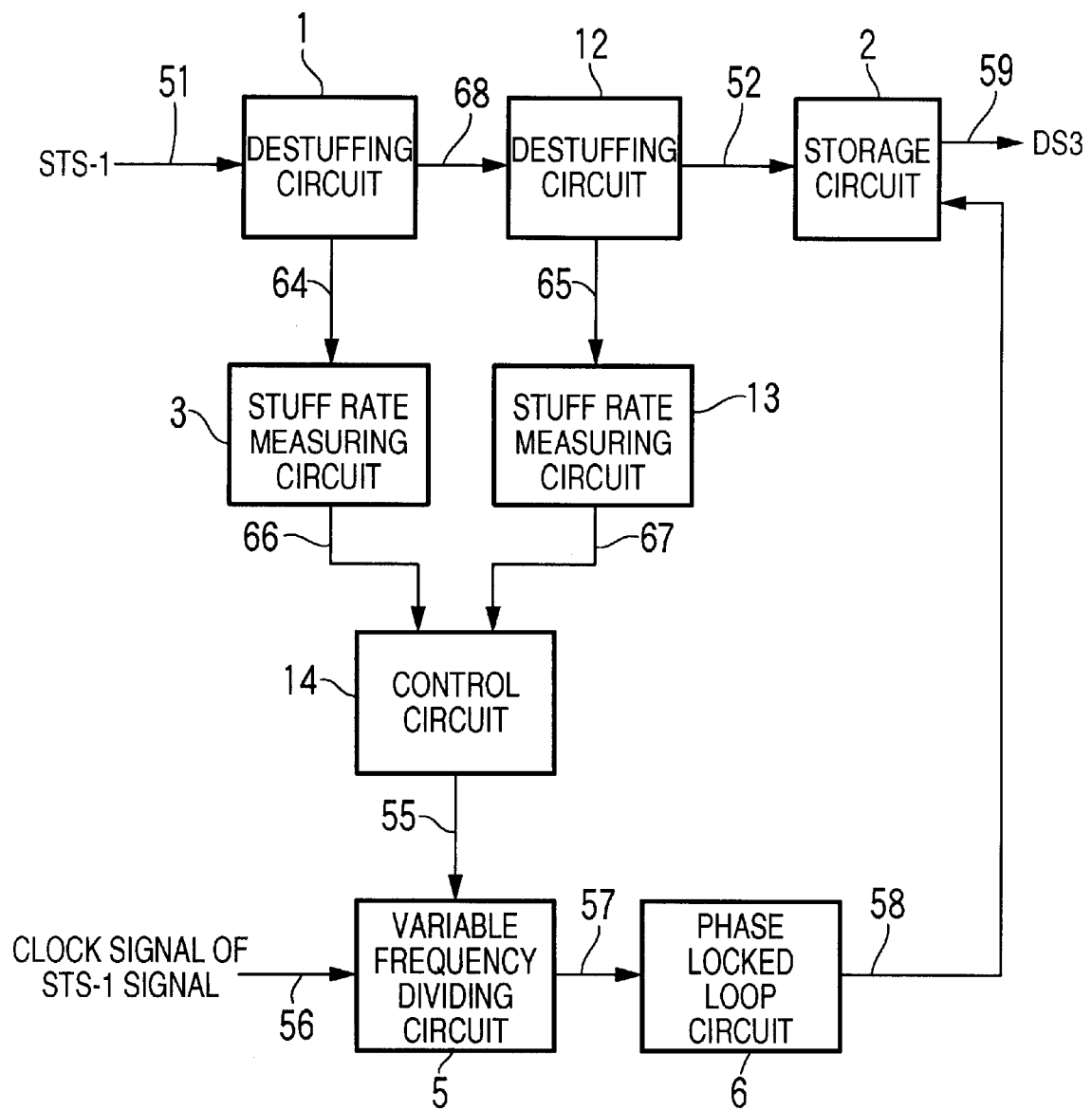
FIG. 4 is a block diagram showing the structure of the clock signal reproducing circuit according to a second embodiment of the present invention.

For this purpose, the clock signal reproducing circuit according to the second embodiment of the present invention with reference to FIG. 4. In the second embodiment, the lower order group signal is accommodated in the higher order group signal through two stages of the stuffing operation.

Figure 17:
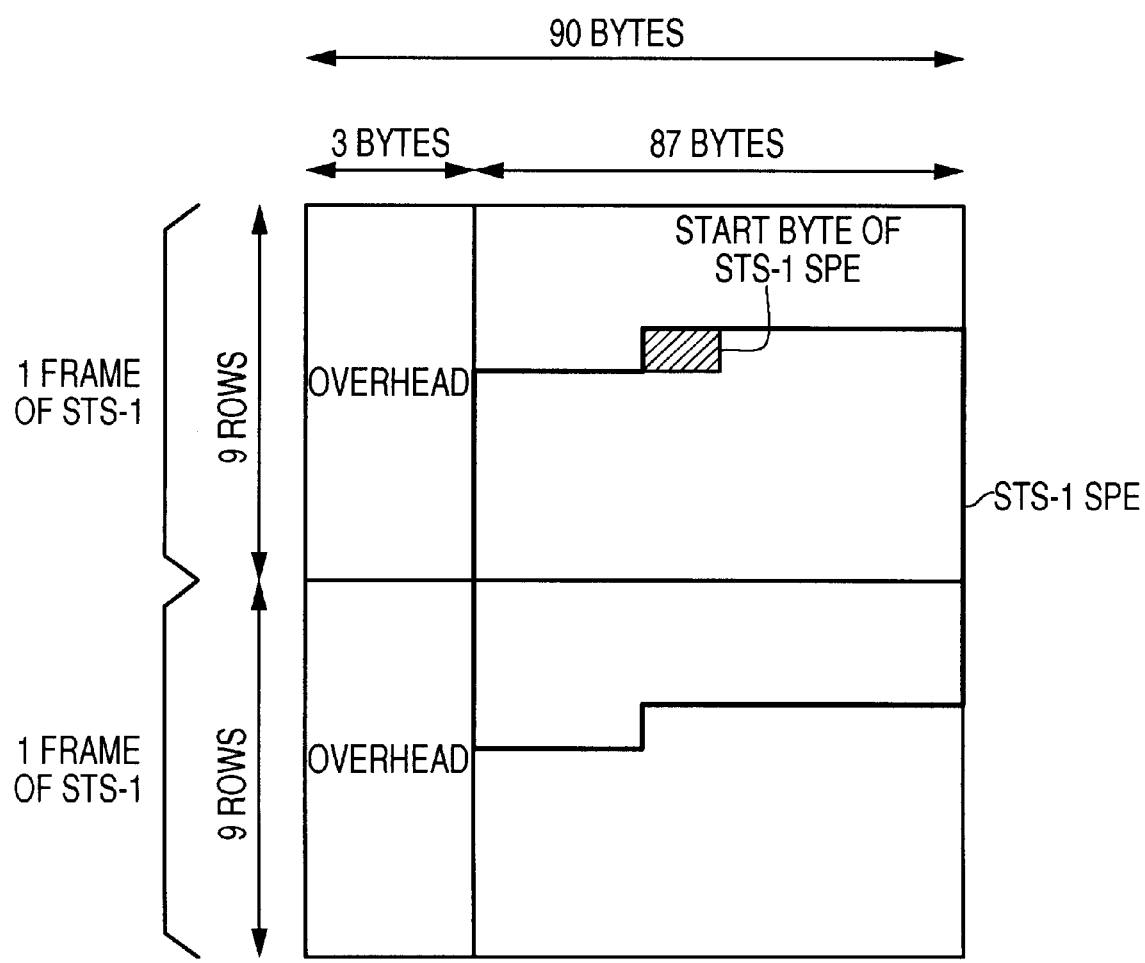
FIG. 17 is a diagram showing a frame structure of STS-1 signal.
Figure 18:
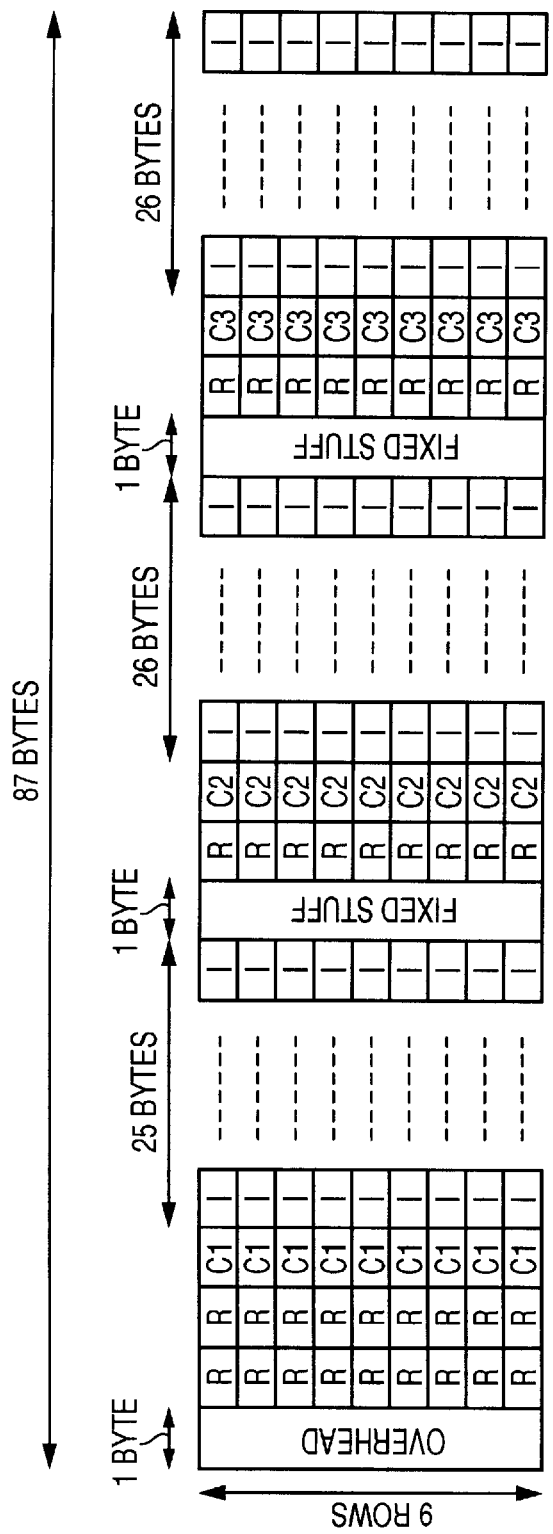
FIGS. 18 and 19 are diagrams showing a frame structure of STS-1 SPE signal and a bit format.
Figure 19:
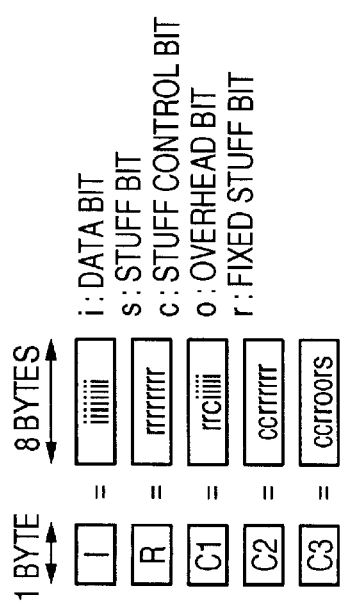

FIG. 4 is a block diagram of the structure of the clock signal reproducing circuit according to the second embodiment of the present invention in which a DS3 signal is accommodated in the frames of an STS-1 signal in accordance with the frame arrangement shown in FIGS. 17 to 19.

When the DS3 signal is accommodated in the STS-1 signal, two stages of the stuffing operation are carried out in which the positive/zero/negative stuffing in the STS-1 signal and the positive stuffing in the STS-1 SPE are used. As shown in FIG. 4, a first de-stuffing circuit 1 detects the positive/zero/negative stuffing in the STS-1 signal 51 and outputs a stuff rate date 64 to the stuff rat measuring circuit 3. Then, the first de-stuffing circuit 1 carries out the de-stuffing operation to delete unwanted bits in the overhead of the STS-1 signal, and extracts the STS-1 SPE signal 68 to supply to a second de-stuffing circuit 12. The second de-stuffing circuit 12 detects the positive stuffing in the STS-1 SPE signal 68 and outputs a second stuff data 65 to a second stuff rate measuring circuit 13. Then, the second de-stuffing circuit 12 carries out the de-stuffing operation to delete unwanted bits in the overhead of the STS-1 SPE signal, and extracts the DS3 signal 52 to supply to the storage circuit 2 in which the extracted DS3 signal is stored in the storage circuit 2.

A first stuff rate measuring circuit 3 measures a stuff rate of the positive/zero/negative stuffing in the STS-1 signal 51 from the stuff data 64 of the STS-1 signal 51 and outputs the rate as a first stuff rate data 66. Similarly, a second stuff rate measuring circuit 13 measures a stuff rate of the positive stuffing in the STS-1 SPE signal 68 from a stuff data 65 of the STS-1 SPE signal 68 and outputs the rate as a second stuff rate data 67.

A variable frequency dividing circuit 5 divides the frequency of the clock signal 56 of the STS-1 signal in accordance with the frequency division ratios M1 or M2. On the other hand, a control circuit 14 for the variable frequency dividing circuit 5 determines the frequency. division ratios for the variable frequency dividing circuit 5 based on the two stuff rate data 66 and 67 supplied from the first stuff rate measuring circuit 3 and the second stuff rate measuring circuit 13, respectively.

Figure 12:
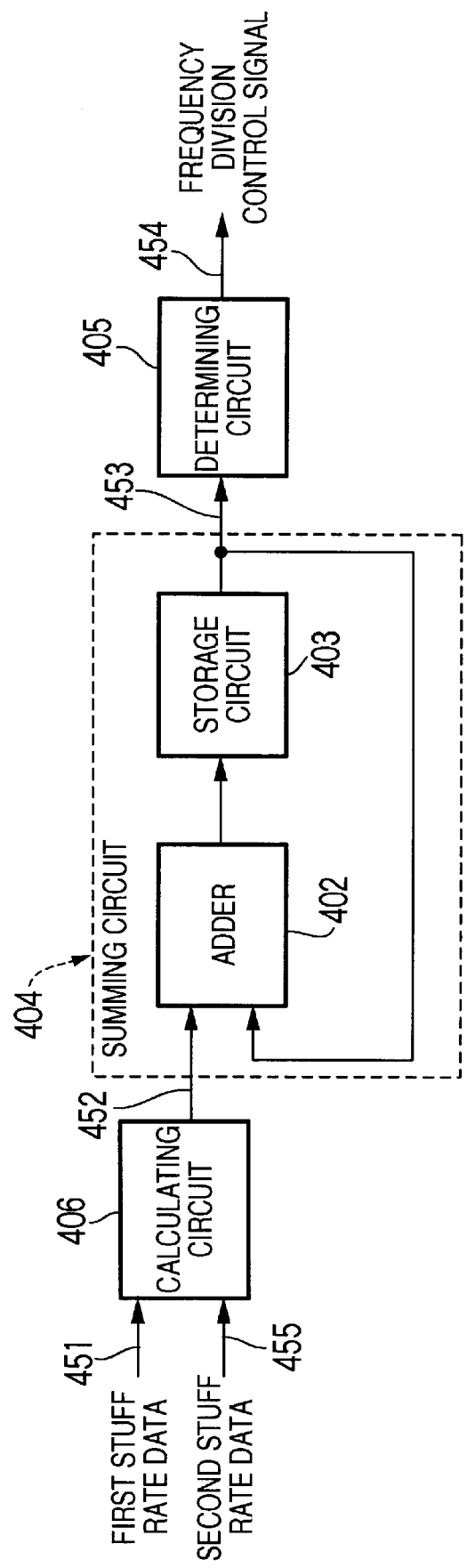
FIG. 12 is a block diagram showing the structure of a variable frequency dividing circuit of the clock signal reproducing circuit in the fifth embodiment.

FIG. 12 is a block diagram of an example of the control circuit 14 shown in FIG. 4. As shown in FIG. 12, a calculating circuit 406 determines an input 452 to a summing circuit 404 from the first stuff rate data 451 and the second stuff rate data 455. The other components and their operations in FIG. 12 are identical to those of the control circuit 4 shown in FIG. 9.

It is supposed that the repetitive frequency of the STS-1 signal is Fh and the stuff rate for the positive/zero/negative stuffing in the STS-1 signal is S1. In this case, Bh=6480, Bl=6264, and Bs=8 for the STS-1 signal, and the bit repetitive frequency Fi of the STS-1 SPE signal is calculated from the following equation (5) using the equation (1).

$$Fi=Fh/\{6480/(6264-8*S1)\}=Fh/\{810/(783-S1)\} \quad (5)$$

Also, it is supposed that the stuff rate for the positive stuffing in the STS-1 SPE signal is S2. In this case, when the DS3 signal is accommodated in the STS-1 SPE signal, one row of the STS-1 SPE signal is considered as one frame. With Bh=696 and Bl=622, the bit repetitive frequency Fl of the DS4 signal is calculated by the following equation (6) using the equation (1).

$$Fl=Fi/\{696/(622-S2)\} \quad (6)$$

From the equations (5) and (6), Fh is expressed by the following equation (7).

$$Fl=Fh/[810*696/\{(783-S1)*(622-S2)\}] \quad (7)$$

The equation 7 shows that the higher order group signal and the lower order group signal are proportional in the clock signal frequency to each other and its constant of proportion k is 810*696/{(783−S1)*(622−S2)}. This corresponds to the equation (1) when the lower order group signal is accommodated in the higher order group signal through the single stage of the stuffing operation. When both sides of the equation 7 are divided by N, the equation (8) is given as follows.

$$Fl/N=Fh/[810*696*N/\{(783-S1)*(622-S2)\}] \quad (8)$$

The equation 8 shows that the clock signal frequency for the lower order group signal divided by N is equal to the clock freluency for the higher order group signal divided by 810*696*N/{(783−S1)*(622−S2)}. This corresponds to the equation 2 when the lower order group signal is accommodated in the higher order group signal through the single stage of the stuffing operation. It is supposed that the variable frequency dividing circuit 5 shown in FIG. 4 can have the two different frequency division ratios of M1 and M2. Also, it is supposed that the ratio of utility of the frequency division ratio of M1 to the frequency division ratio of M2 is R1:R2=1−R1. In this case, the clock signal for the higher order group signal can be divided in frequency by 810*696*N/{(783−S1)*(622−S2)} when R1 and R2 are determined in such a manner that the equation (9) is met.

$$R1*M1+R2*M2=810*696*N/\{(783-S1)*(622-S2)\} \quad (9)$$

The equation (9) corresponds to the equation (3) when the lower order group signal is accommodated in the higher order group signal through the single stage of the stuffing operation. Using R1=1−R2, the equation (10) is transformed to the equation (10).

$$R2=[810*696*N/\{(783-S1)*(622-S2)\}-M1]/(M2-M1) \quad (10)$$

The equation 10 corresponds to the equation (4) when the lower order group signal is accommodated in the higher order group signal through the single stage of the stuffing operation. Because M1, M2, and N are predetermined, R2 can be calculated from the stuff rate S1 for the positive/zero/negative stuffing in the STS-1 signal and the stuff rate S2 for the positive stuffing in the STS-1 SPE signal, using the equation (10).

The control circuit 14 shown in FIG. 4 is constituted by the circuit shown in FIG. 12, and R2 is calculated by the calculating circuit 406 using the equation 10. At this time, R2 represents a rate that the output of the determining circuit 405 is "1". The variable frequency dividing circuit 5 shown in FIG. 4 carries out the frequency division by M1 in response to "0" of the variable frequency division control signal 55 and the frequency division by M2 in response to "1" of the same. Thus, the output 454 of the determining circuit 405 shown in FIG. 12 can be used as the variable frequency division control signal 55 of FIG. 4.

Returning to FIG. 4, the variable frequency dividing circuit 5 carries out the frequency division based on the frequency division ratios of M1 and by M2, when the variable frequency division control signal 55 is "0" and "1", respectively. Then, the frequency of the clock signal 57 outputted from the variable frequency dividing circuit 5 is equal to 1/N the clock signal frequency for the lower order group signal. The phase synchronization oscillator (phase locked loop) circuit 6 generates a clock signal whose frequency is N times greater than the frequency of the clock signal 57 outputted from the variable frequency dividing circuit 5. Hence, the frequency of the clock signal 58 outputted from the phase synchronization oscillator circuit 6 is equal to that for the lower order group signal, allowing the reproduction of the clock signal for the lower order group signal. The reproduced clock signal 58 for the lower order group signal is then used for reading out the lower order group signal 59 from the storage circuit 2.

More particularly, M1, M2, and N are now considered in practice. Supposing that M1=16 and M2=17 for a first example, N is determined as follows. The nominal clock signal frequency for the higher order group signal is 51.84 MHz. At this time, 51.84 MHz/16=3.24 MHz or 51.84 MHz/17=3.09 MHz. Thus, the frequency of the clock signal outputted from the variable frequency dividing circuit 5 ranges from 3.09 MHz to 3.24 MHz. When N=14, the nominal clock signal frequency for the lower order group signal, 44.736 MHz divided by N falls in the range.

For a second example, M1 and M2 can be determined when N=16 is given. Because 44.736 MHz/16=2.796 MHz, the range of the frequencies of the clock signals outputted from the variable frequency dividing circuit 5 has to include 2.796 MHz. This is satisfied when M1≦18 and M2≧19 because 51.84 MHz/2.796 MHz=18.84 is met. As described previously, the difference between the frequency division ratios of M1 and M2 is preferably "1" for minimizing the effect of jitter in the clock signal outputted from the variable frequency dividing circuit 5. Hence, M1=18 and M2=19 are desired. There would be a case where N can not be set to a natural number due to the values of frequency division ratios of M1 and M2. Also, there would be a case where the difference between frequency division ratios of M1 and M2 is not "1" due to the value of N. In such cases, the other conditions may properly be modified for the equal effect.

Figure 1:
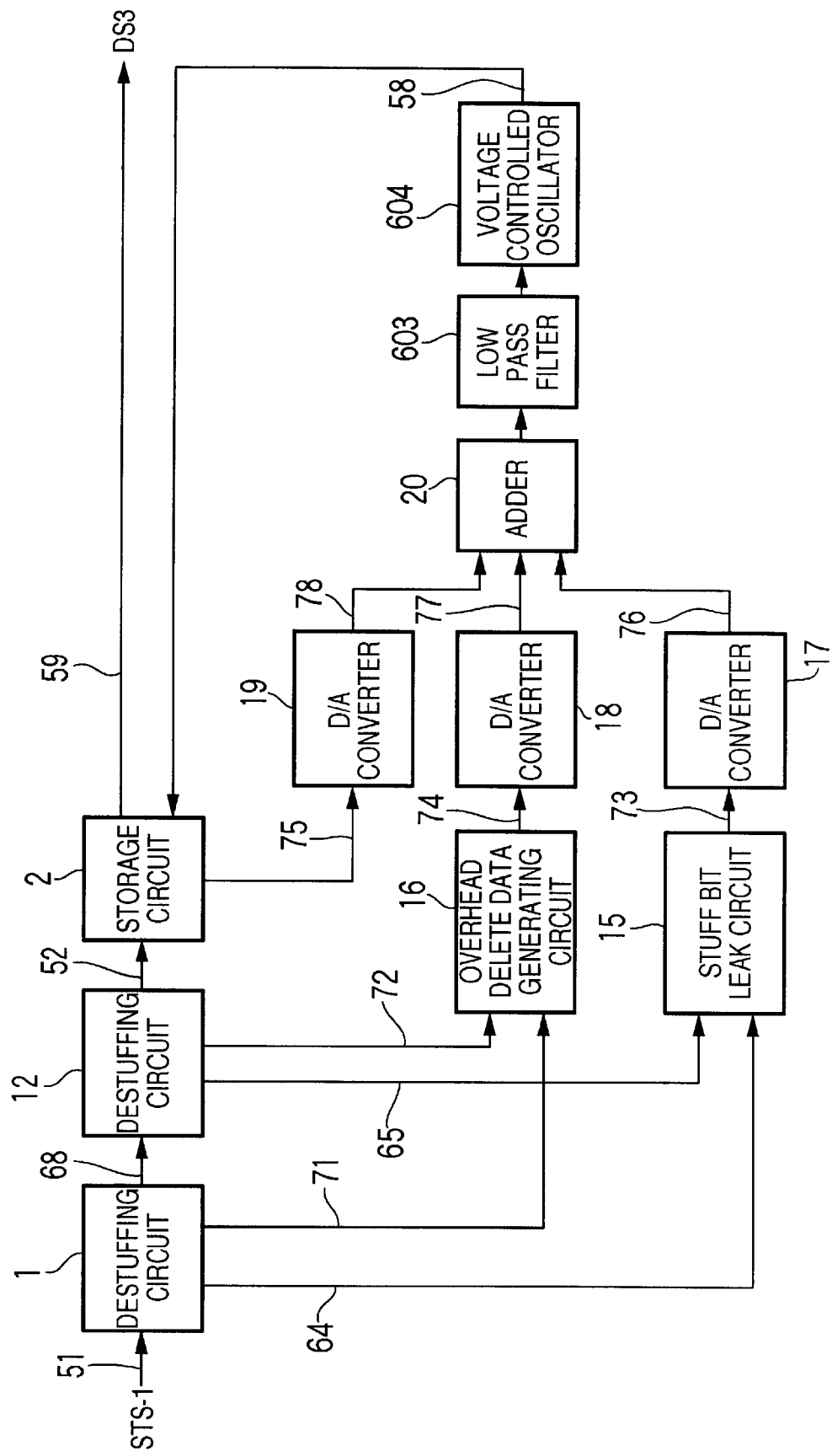
FIG. 1 is a block diagram showing the structure of a first conventional a clock signal reproducing circuit.
Figure 2:
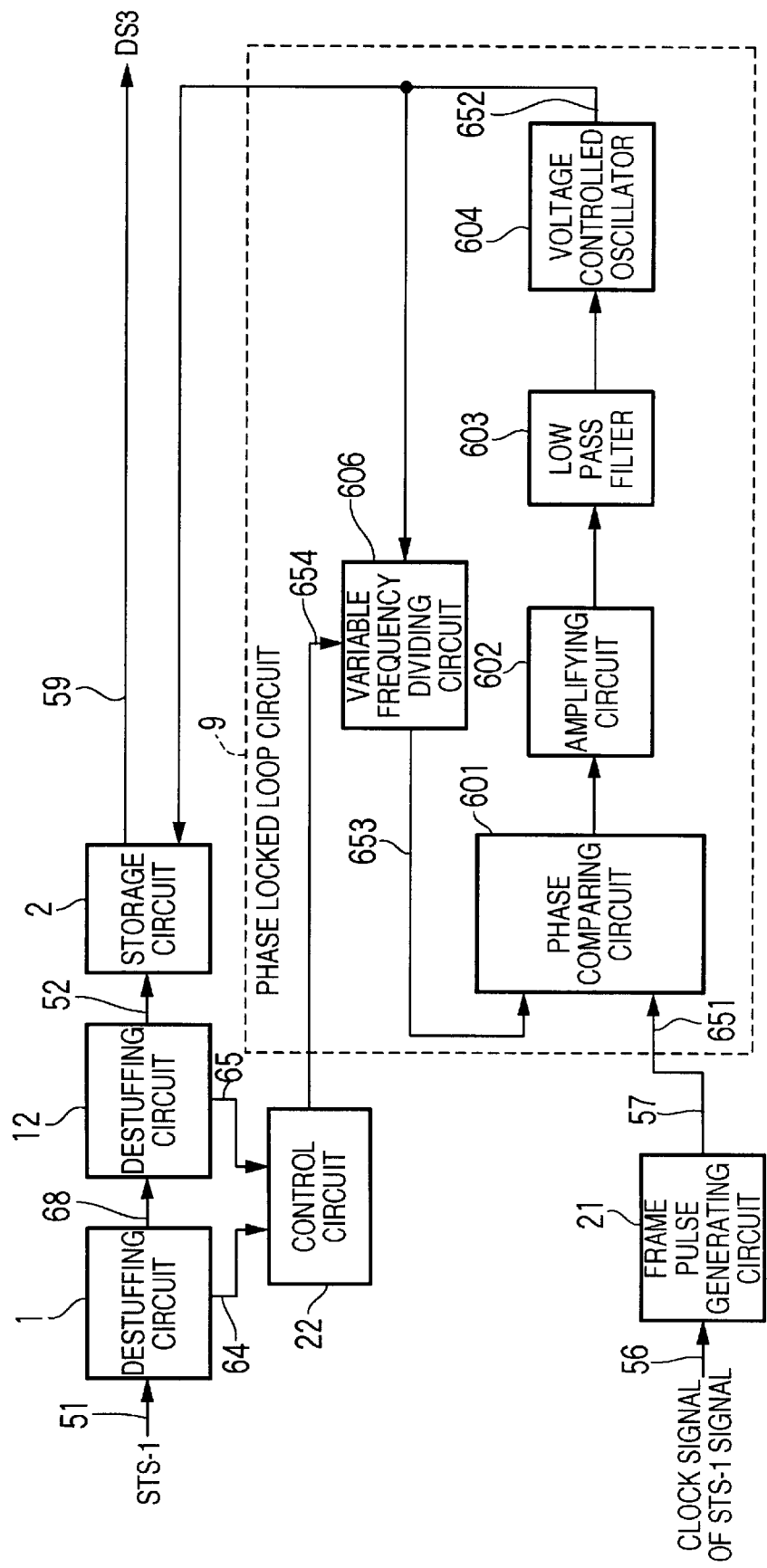
FIG. 2 is a block diagram showing the structure of a second conventional a clock signal reproducing circuit.

The second embodiment of the present invention shown in FIG. 4 will now be compared with the conventional technique. In the conventional technique shown in FIG. 1, the overhead delete data 74 is used which is unrelated to the stuffed pulses. The second embodiment of the present invention shown in FIG. 4 does not use overhead delete data but only the stuff data. Hence, the circuit arrangement is smaller in the size than that of the conventional technique shown in FIG. 1. Also, the phase synchronization oscillator circuit 9 in the circuitry arrangement of the prior art shown in FIG. 18 has a frequency division ratio of as a large value as 5592. In the second embodiment of the present invention shown in FIG. 4, the frequency division ratio of the phase synchronization oscillator circuit is favorably not higher than 100.

Accordingly, the reproduced clock signal hardly suffers from phase noises which are inevitable in the conventional technique and will thus be improved in the quality.

Figure 5:
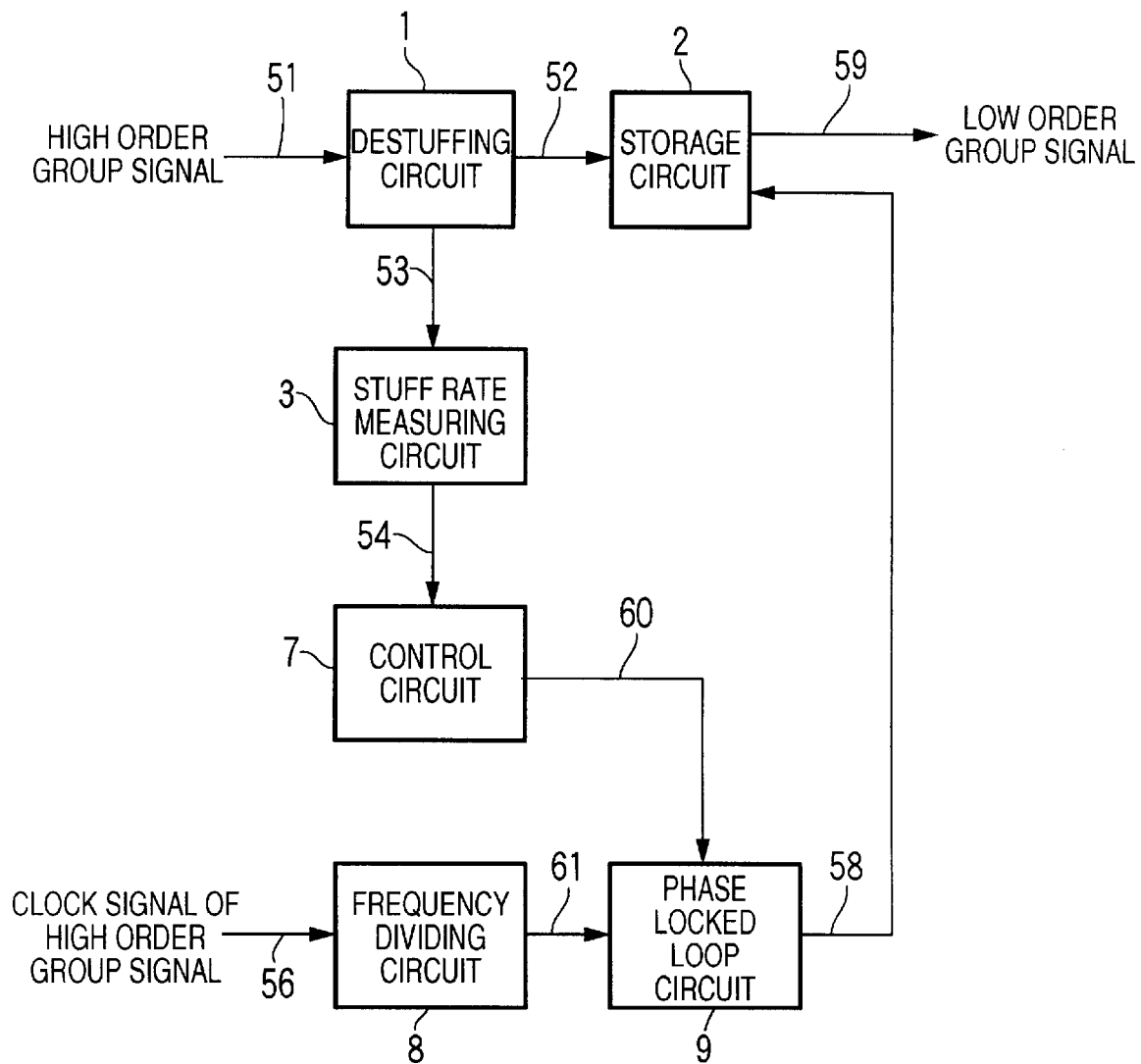
FIG. 5 is a block diagram showing the structure of the clock signal reproducing circuit according to a third embodiment of the present invention.

Other embodiments of the present invention will be described in more detail referring to the relevant drawings. FIG. 5 is a block diagram showing the structure of the clock signal reproducing circuit according to the third embodiment of the present invention. The circuit structure shown in FIG. 5 is different from that shown in FIG. 3 in the following points. That is, the clock signal 56 for the higher order group signal is divided in frequency by a variable in the variable frequency dividing circuit 5 shown in FIG. 3. However, the same is fixedly divided in frequency based on a constant frequency division ratio M in the frequency dividing circuit 8. Also, the frequency division ratio of the phase synchronization oscillator 6 shown in FIG. 3 is a fixed number, while the same shown in FIG. 5 is a variable. The variable factor is determined by the control circuit 7.

Figure 13:
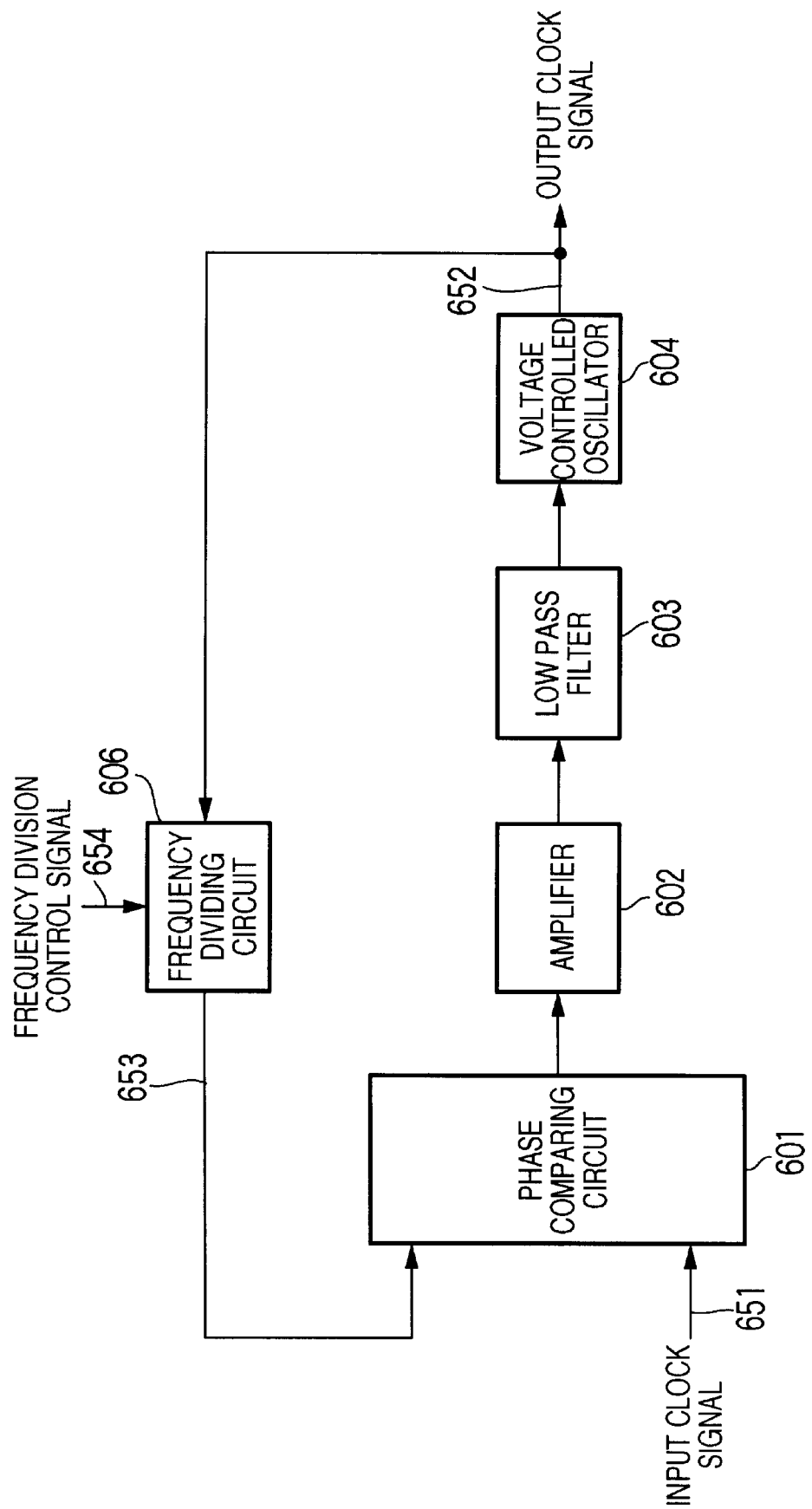
FIG. 13 is a block diagram showing an example of a phase synchronization oscillator circuit in the second embodiment.

The de-stuffing circuit 1, the storage circuit 2, and the stuff rate measuring circuit 3 of the structure shown in FIG. 3 are identical in their structure and operation to those shown in FIG. 5. The stuff rate measuring circuit 3 and the control circuit 7 shown in FIG. 5 may be realized by the circuits shown in FIGS. 8 and 9. FIG. 13 is a block diagram of an example of the phase synchronization oscillator circuit shown in FIG. 5. As shown in FIG. 5, the output of a voltage controlled oscillator circuit 604 is averagely divided in frequency by a variable frequency dividing circuit 606, since N is not always a natural number. Then, the frequency-divided signal is subjected to phase comparison with a clock input 651 by a phase comparing circuit 601. An output of the phase comparing circuit 601 is passed through an amplifier circuit 602 and a low pass filter 603 and fed to the voltage controlled oscillator circuit 604 for controlling the oscillation frequency.

In the phase synchronization circuit shown in FIG. 13, the voltage controlled oscillator circuit 604 generates a clock signal whose frequency is N times greater than the frequency of the clock input and outputs as clock output 652. The structure of the phase synchronization circuit is well known by those skilled in the art. The frequency division ratio is a variable and the clock signal is produced of which the frequency is N times greater than that of the clock signal inputted thereto, when N is not always a natural number.

The operation of the clock signal reproduced circuit according to the third embodiment of the present invention shown in FIG. 5 will be now described. When the lower order group signal is accommodated in the higher order group signal through a single stage of the stuffing operation, the equation (1) is met. As both sides of the equation 1 are divided by M, the equation (1) is transformed into the following equation (11).

$$Fh/M=Fl/\{M^*(Bl-S^*Bs)/Bh\} \tag{11}$$

The equation (11) corresponds to the equation (2) of the first embodiment of the present invention. The equation (11) shows that the frequency of the clock signal for the higher order group signal divided by M is equal to the frequency of the clock signal for the lower order group signal divided by $M^*(Bl-S^*Bs)/Bh$. Because Bh, Bl and Bs are predetermined, $M^*(Bl-S^*Bs)/Bh$ can practically be calculated from the stuff rate S. Here, it is supposed that the frequency division ratios of the variable frequency dividing circuit 606 shown in FIG. 13 are N1 and N2. Also, it is supposed that the ratio of utility of N1 to N2 is R1:R2=1−R1. In this case, the frequency for the lower order group signal can be divided by $M^*(Bl-S^*Bs)/Bh$ when the values R1 and R2 are controlled so that the equation (12) is satisfied.

$$R1^*N1+R2^*N2=M^*(Bl-S^*Bs)/Bh \tag{12}$$

The equation (12) corresponds to the equation (3) in the first embodiment of the present invention. Using R1=1−R2, the equation (12) is transformed into the following equation (13).

$$R2=\{M^*(Bl-S^*Bs)/Bh-N1\}/(N2-N1) \tag{13}$$

The equation (13) corresponds to the equation (4) in the first embodiment of the present invention. As Bh, Bl and Bs are known and N1, N2, and M are predetermined, R2 can be calculated from the stuff rate S using the equation 13. When the control circuit 7 shown in FIG. 5 is realized by the circuit structure shown in FIG. 9, R2 is calculated by the calculating circuit 401 shown in FIG. 9 using the equation (13). The value R2 represents a rate that the output of the determining circuit 405 is "1". Therefore, the frequency division ratio of the phase synchronization oscillator circuit 9 is set to N1 based on "0" of the variable frequency division control signal 60 and to N2 based on "1" of the same. In this way, the output 454 of the determining circuit 405 shown in FIG. 9 can be used as the variable frequency division control signal 60 of FIG. 5.

Returning to FIG. 5, the frequency division ratios of the phase synchronization oscillator circuit 9 are N1 and N2, when the variable frequency division control signal 60 has the values of "0" and "1", respectively. The frequency of the clock signal outputted from the phase synchronization oscillator circuit 9 is equal to $Bh/(M^*(Bl-S^*Bs))$ times greater than the clock signal frequency of the frequency dividing circuit 8. The frequency dividing circuit 8 divides the frequency of the clock signal 56 for the higher order group signal by M. Hence, the phase synchronization oscillator circuit 9 generates a clock signal whose frequency is $Bh/\{M^*(Bl-S^*Bs)\}$ times greater than the frequency of the clock signal for the higher order group signal. As shown in the equation (1), the frequency of the clock signal 58 outputted from the phase synchronization oscillator circuit 9 is equal to the frequency of the clock signal for the lower order group signal. Thus, the clock signal for the lower order group signal can be reproduced. The reproduced clock signal 58 for the lower order group signal is used for reading out the lower order group signal 59 from the storage circuit 2.

The equations (11) to (13) are applicable when the lower order group signal is accommodated in the higher order group signal through a single stage of the stuffing operation. However, the equations (11) to (13) need be properly modified when the lower order group signal is accommodated in the higher order group signal through two or more stages of the stuffing operation. Also, the second embodiment is applicable to the third embodiment.

Specific examples of N1, N2, and M will be described referring to FIGS. 17 to 19 in which the higher order group signal is STS-1 signal and the lower order group signal is DS3 signal.

First, consider a case that M is determined, when N1=16 and N2=17 are given. Because 44.736 MHz/16=2.796 MHz and 44.736 MHz/17=2.632 MHz, the frequency of the clock output 653 of the variable frequency dividing circuit 606 shown in FIG. 13 needs to range from 2.632 MHz to 2.796 MHz. When M=19, the frequency of the clock signal 61 outputted from the frequency dividing circuit 8 where the clock signal frequency 56 for the higher order group signal is divided by M falls in the range.

Next, consider a case that N1 and N2 are determined when M=16 is given. Because 51.84 MHz/16=3.24 MHz, the range of the frequencies of the clock signal 653 outputted from the variable frequency dividing circuit 606 has to include 3.24 MHz. This is satisfied when N1≦13 and N2≧14, because 44.736 MHz/3.24 MHz=13.8 is established. The difference between N1 and N2 is preferably "1" for minimizing the effect of jitter in the clock signal outputted from the variable frequency dividing circuit. Hence, N1=18 and N2=19 are determined.

As described above, in the third embodiment of the present invention shown in FIG. 5, the stuff rate measuring circuit 3 is used. This allows the frequency division ratio of the phase synchronization oscillator circuit to be set to favorably not higher than 100 which is impossible in the conventional technique shown in FIG. 1.

In the first embodiment of the present invention, the clock signal for the higher order group signal is divided in frequency by the variable frequency dividing circuit. On the other hand, in the third embodiment of the present invention, the frequency division ratio of the phase synchronization oscillator circuit is variable. In the fourth embodiment of the present invention, the clock signal for the higher order group signal is divided in frequency by a variable frequency dividing circuit, and the frequency division ratio of a phase synchronization oscillator (phase locked loop) circuit is a variable. Also, an average value of the frequency division ratios is controlled. At this time, the average value is not necessarily a natural number.

Figure 6:
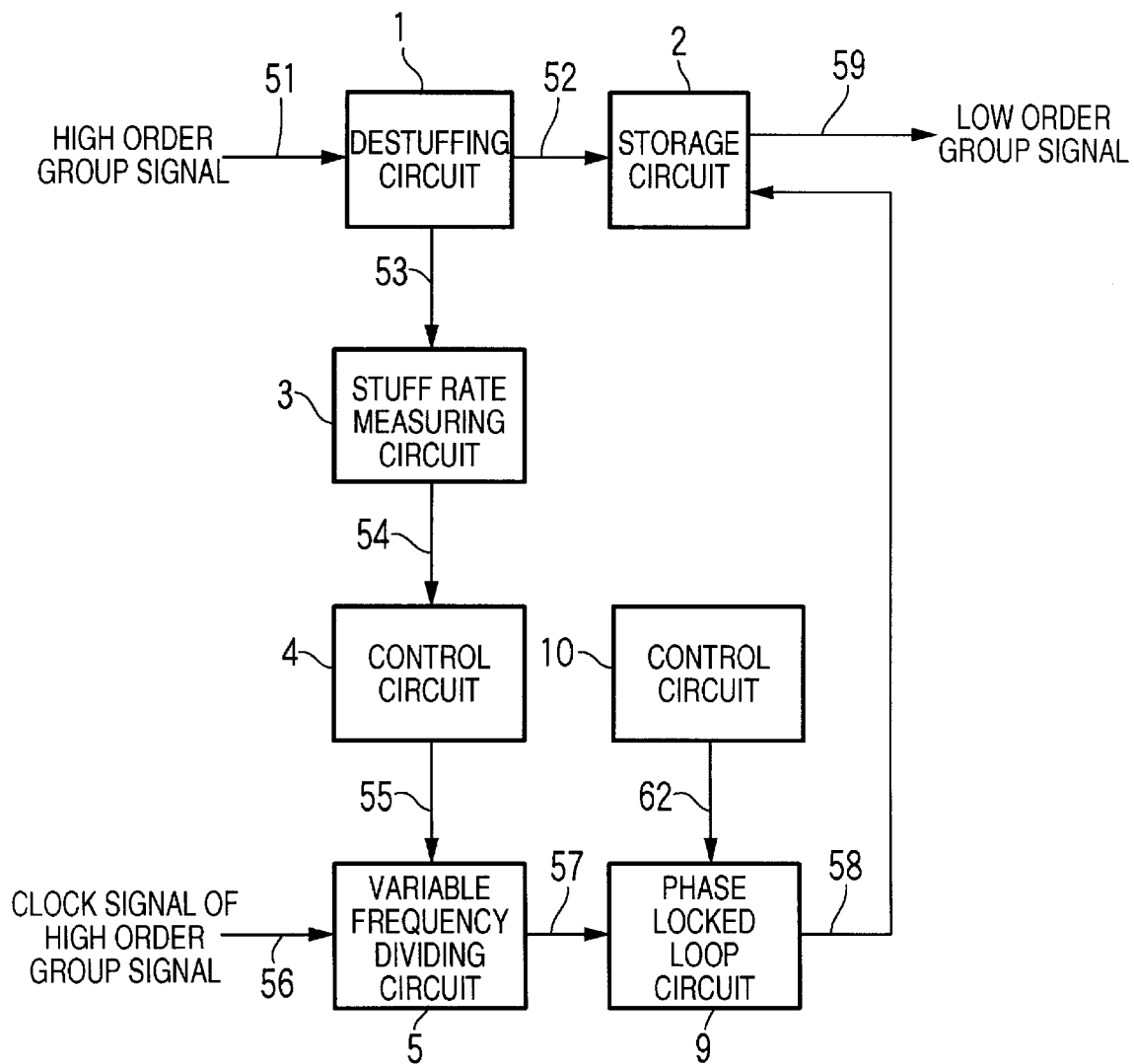
FIG. 6 is a block diagram showing the structure of a clock signal reproducing circuit according to a fourth embodiment of the present invention.

FIG. 6 is a block diagram showing the structure of the clock signal reproduced circuit according to the fourth embodiment of the present invention. The structure of the fourth embodiment shown in FIG. 6 is different from that of the first embodiment shown in FIG. 3 in the following point. That is, the frequency division ratio of a phase synchronization oscillator circuit 9 shown in FIG. 6 is a variable while the frequency division ratio of the phase synchronization oscillator circuit 6 shown in FIG. 3 is fixed. The frequency division ratio of the phase synchronization oscillator circuit 9 is determined by a control circuit 10. The phase synchronization oscillator circuit 9 shown in FIG. 6 may be realized to have the circuit structure of FIG. 13. The frequency division ratio of a variable frequency circuit 5 shown in FIG. 6 is determined by a control circuit 4 for a variable frequency dividing circuit 5. The control circuit 4 shown in FIG. 6 is identical in the operation to the control circuit 3 shown in FIG. 3. Also, the control circuit 10 shown in FIG. 6 controls the phase synchronization oscillator circuit 9 such that the frequency division ratio of the phase synchronization oscillator circuit 9 has a predetermined average value.

Figure 14:
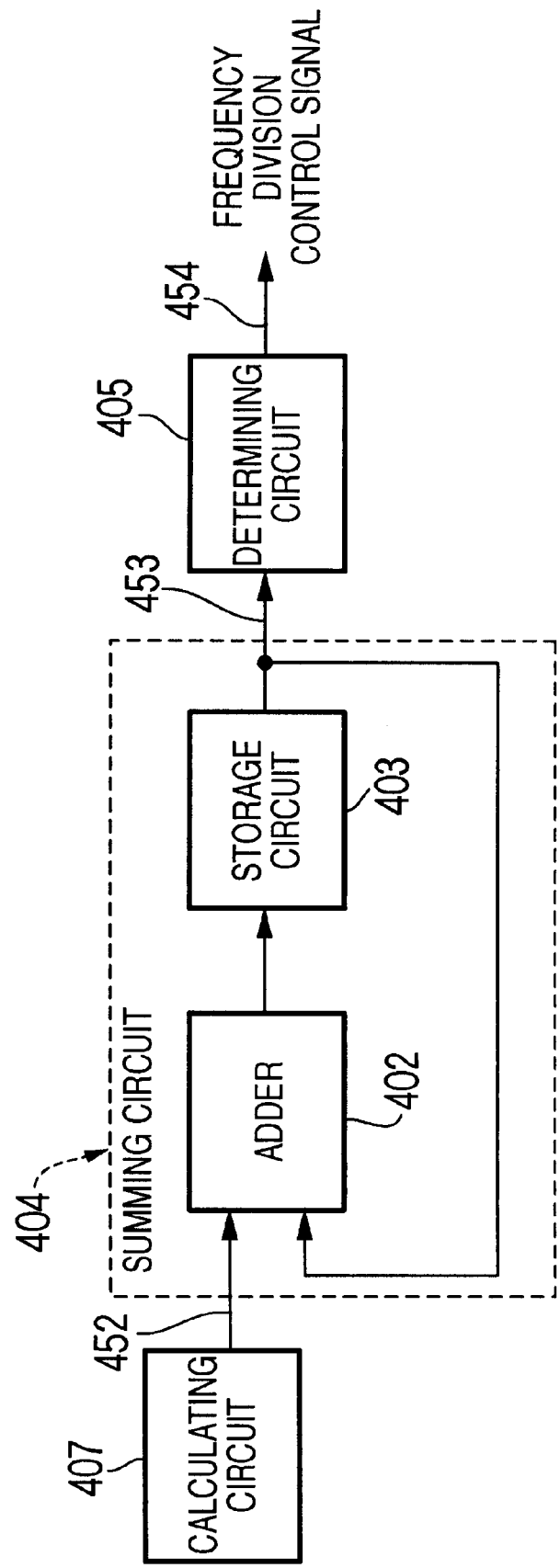
FIG. 14 is a block diagram showing an example of a control circuit for a variable frequency dividing circuit of the clock signal reproducing circuit in the third embodiment.

FIG. 14 is a block diagram of an example of the control circuit 10 shown in FIG. 6. As shown in FIG. 14, a calculating circuit 407 determines an input 452 to an summing circuit 404 based on a predetermined data without using external data. The other components and their operations shown in FIG. 14 are identical to those of the control circuit shown in FIG. 9. Also, the other components and their operations shown in FIG. 6 are identical to those shown in FIG. 3. Further, the second embodiment is applicable to the fourth embodiment.

An average frequency division ratio N of the phase synchronization oscillator circuit 9 shown in FIG. 6 can be expressed by Q1*N1+Q2*N2, where the rate for dividing in frequency by N1 is Q1 and the rate for dividing in frequency by N2 is Q2=1−Q1. When N1, N2, and N are given, Q2 can be calculated using the following equation (14). However, N is not necessarily a natural number.

$$Q2=(N-N1)/(N2-N1) \qquad (14)$$

The control circuit 10 shown in FIG. 6 is realized to have the circuit structure shown in FIG. 14 and the phase synchronization oscillator circuit 9 shown in FIG. 6 is realized to have the circuit structure shown in FIG. 13. The variable frequency dividing circuit 606 shown in FIG. 13 carries out the frequency division by N1 based on "0" of the variable frequency division control signal 654 and the frequency division by N2 based on "1" of the same. In this case, the phase synchronization oscillator circuit 9 shown in FIG. 6 carries out the frequency division by averagely N. When M1, M2, N1, N2, and N are properly selected and determined, the frequency of a clock signal 58 outputted from the phase synchronization oscillator circuit 9 can be equal to the frequency of the clock signal for the lower order group signal. Thus, the clock signal can be reproduced.

The structure shown in FIG. 6 may be utilized in case that the structure of in FIG. 3 or 4 can not be used for any natural number of N. For example, when M1=8 and M2=9 in the structure of the first or second embodiment of the present invention, 51.84 MHz/7=7.406 MHz and 51.84 MHz/8=6.48 MHz are established. The frequency of the clock signal 57 outputted from the variable frequency dividing circuit 5 shown in FIG. 4 falls within a range from 6.48 MHz to 7.406 MHz. In this case, when N is a natural number, the frequency of 44.736 MHz divided by N is not within the range.

In the fourth embodiment of the present invention, the average frequency division ratio of the phase synchronization oscillator circuit 9 is controlled to be 6.4. In this case, the frequency of the clock signal can be included within the frequency range of the clock signal outputted from the variable frequency dividing circuit 5. Now, it is supposed that N1=6, N2=7, and N=6.4. In this case, Q2=0.4 is determined from the equation (14). Thus, the control circuit 10 shown in FIG. 6 is realized to have the circuit structure shown in FIG. 14, and the summing circuit carries out the repetitive adding operation for 0.4. Thus, the average frequency division ratio of the phase synchronization oscillator circuit 9 can be 6.4, permitting the frequency of 44.736 MHz divided by N to fall within a range from 6.48 MHz to 7.406 MHz.

In the third embodiment of the present invention, the frequency of the clock signal for the higher order group signal is divided by the frequency division ratio of a natural number by the typical common frequency dividing circuit. However, similar to the above, it could be considered that the frequency of the clock signal for the higher order group signal is divided by a predetermined average frequency division ratio, which is not necessarily a natural number, by the variable frequency dividing circuit. Therefore, in the clock signal reproducing circuit according to the fifth embodiment of the present invention, the frequency of the clock signal for the higher order group signal is divided in frequency using a variable frequency dividing circuit whose frequency division ratio is a variable. At the same time, the frequency division ratio of the phase synchronization oscillation circuit is set to be variable. The average frequency division ratio of the variable frequency dividing circuit is controlled to be a predetermined value which is not necessarily a natural number.

Figure 7:
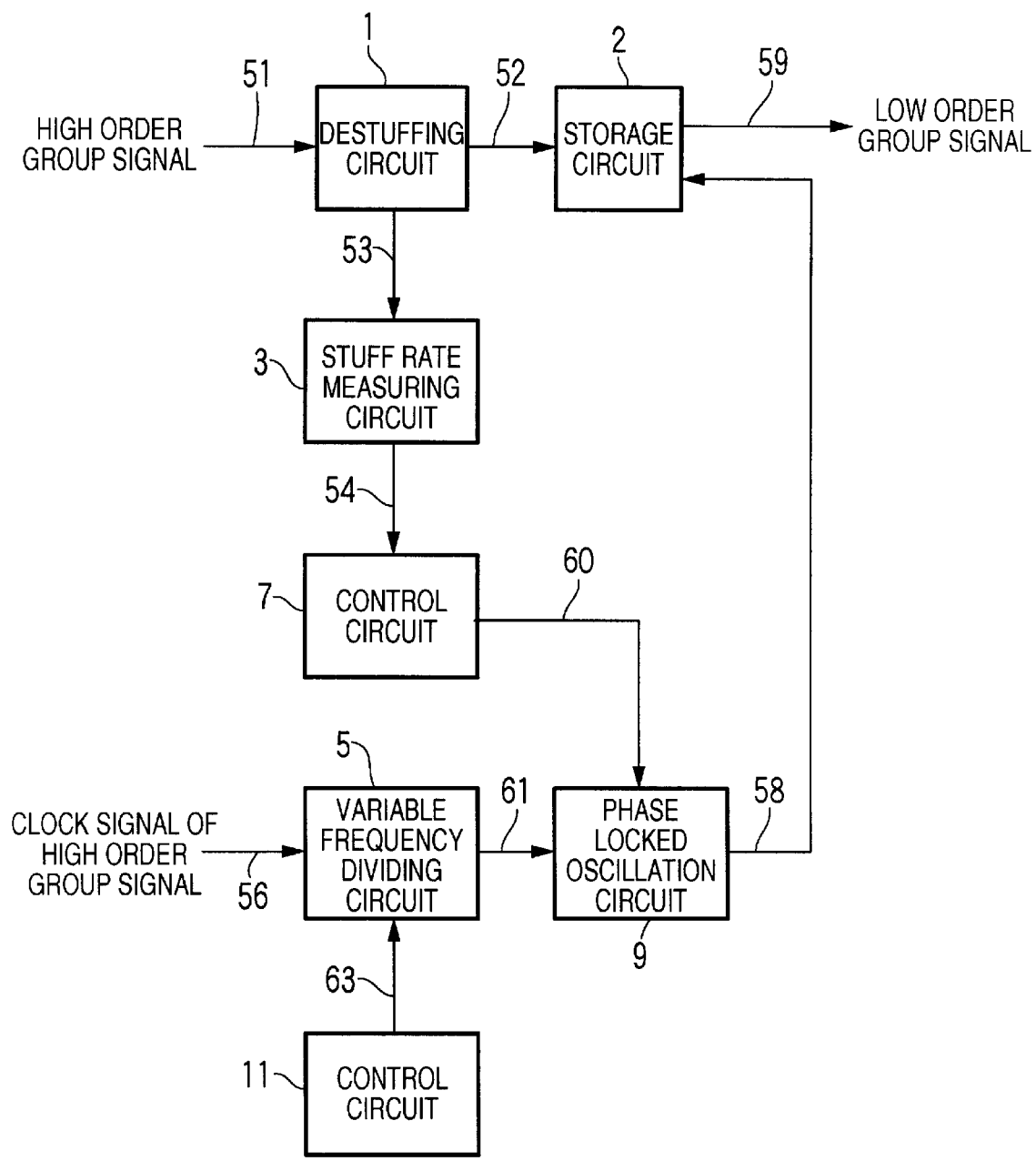
FIG. 7 is a block diagram showing the structure of a clock signal reproducing circuit according to a fifth embodiment of the present invention.

FIG. 7 is a block diagram showing a structure of the clock signal reproducing circuit according to the fifth embodiment of the present invention. In the fourth embodiment shown in FIG. 5, the clock signal 56 for the higher order group signal is divided in frequency by the frequency dividing circuit 8. However, in the clock signal reproducing circuit of the fifth embodiment shown in FIG. 7, the clock signal 56 for the higher order group signal is divided in frequency by a variable frequency dividing circuit 5 of which the frequency division ratio is determined by a control circuit 11. A phase synchronization oscillator (phase locked loop) circuit shown in FIG. 7 may be realized to have the structure shown in FIG. 13 and its frequency division ratio is determined and controlled by a control circuit 7 shown in FIG. 7. The control circuit 7 shown in FIG. 7 carries out the same operation as the control circuit shown in FIG. 5, and the control circuit 11 shown in FIG. 7 controls the frequency division ratio of the variable frequency dividing circuit 5 to have an predetermined average value. The other components and their operations shown in FIG. 7 are identical to those shown in FIG. 5 as denoted like numerals.

When the rate of the frequency division ratio of M1 is R1 and the rate the frequency division ratio of M2 is R2=1−R1, the average frequency division ratio of M in the variable frequency dividing circuit 5 shown in FIG. 7 can be expressed by R1*M1+R2*M2. When M1, M2, and M are given, R2 can be calculated using the following equation (15). However, M is not necessarily a natural number.

$$R2=(M-M1)/(M2-M1) \quad (15)$$

The control circuit 11 shown in FIG. 7 is realized to have the circuit structure shown in FIG. 14 and the summing circuit carries out the repetitive adding operation for the value of R2. The variable frequency dividing circuit 5 shown in FIG. 7 carries out the frequency division by M1 based on "0" of a first variable frequency division control signal 63 and the frequency division by M2 based on "1" of the same. Thus, the frequency division by M can be made averagely. When M1, M2, N1, N2, and M are properly determined, the frequency of a clock signal 58 outputted from the phase synchronization oscillator circuit 9 shown in FIG. 7 becomes equal to the frequency of the clock signal for the lower order group signal. Thus, the clock signal for the lower order group signal can be reproduced.

As compared with the fourth embodiment of the present invention, the fifth embodiment may be applicable when M can not be determined to a natural number in the third embodiment of the present invention. In common, the frequency of the clock signal for the higher order group signal is definitely higher than that for the lower order group signal. Therefore, M can generally be a natural number in the third embodiment of the present invention. In the second embodiment of the present invention, there may be a case that the frequency division ratio of the frequency dividing circuit 8 shown in FIG. 5 is not found in natural numbers favorably.

In the third embodiment shown in FIG. 5, for example, it is assumed that the higher order group signal is STS-1 and the lower order group signal is DS3, and N1=6 and N2=7 are given. In this case, because 44.736 MHz/6=7.456 MHz and 44.736 MHZ/7=6.391 MHz, the frequency of the clock signal 58 outputted from the phase synchronization oscillator circuit 9 shown in FIG. 5 falls within a range from 6.391 MHz to 7.456 MHz. When M=7 or M=8, M being a natural number, the frequency of the clock signal 61 outputted from the frequency dividing circuit 8 resulted from the frequency division of the clock signal 56 for the higher order group signal by M can be within the range. In this case, when either M=7 or M=8, 51.84 MHZ/7=7.406 MHz and 51.84 MHz/8=6.48 MHz are given. The frequencies of the clock signals 61 outputted from the frequency dividing circuit 8 shown in FIG. 5 are close to the end portions of the range permitted for frequencies of the clock signal 58 outputted from the phase synchronization oscillator circuit 9. On considering the effect of fluctuation on the clock signal frequency for the higher order group signal or the lower order group signal, it is highly desired that the frequency of the clock signal 61 outputted from the frequency dividing circuit 8 stays near the center of the range of frequencies of the clock signal 58 outputted from the phase synchronization oscillator circuit 9. In the fifth embodiment of the present invention, M=7.5 is permitted, as it is not necessarily required that M is a natural number. The frequency of 51.84 MHz/7.5=6.912 MHz falls approximately in the center of the range of frequencies of the clock signal 58 outputted from the phase synchronization oscillator circuit 9.

In the first embodiment of the present invention, the clock signal for the higher order group signal is frequency divided by the variable frequency dividing circuit. However, in case that a number of lower order group signals are multiplexed on the higher order group signal, the frequency of the clock signal for the higher order group signal may be not directly divided by the variable frequency dividing circuit but divided by a frequency dividing circuit having a fixed frequency division ratio and then by the variable frequency dividing circuit having a variable frequency division ratio. For example, an STS-3 (synchronous transport signal level 3) signal is defined which is produced by multiplexing three STS-1 signals as depicted in ANSI T1.105-1995. In this case, there may be a case that the DS3 lower order group signal is accommodated in at least one of the three STS-1 signals of the STS-3 higher order group signal.

For the above case, as shown in FIG. 13, in the clock signal reproducing circuit according to the sixth embodiment of the present invention, the higher order group signal 51 is separated by a separating circuit 14 and a resultant separated signal containing one lower order group signal is fed to the de-stuffing circuit 1. Also, the clock signal 56 for the higher order group signal is divided in frequency by n (n is a natural number) by a frequency dividing circuit 15 and then transmitted to the variable frequency dividing circuit 5. When the multiplexing degree of the higher order group signal is equal to the frequency division ratio n of the frequency dividing circuit 15, the succeeding procedure can be identical to that of the structure shown in FIG. 3. It is not always necessary that the multiplexing degree is equal to the frequency division ratio n. In this case, the same effect could be given by selecting and determining M1, M2, and N. Also, n=1 is possible. In this case, the frequency dividing circuit 15 shown in FIG. 15 can be omitted.

A practical example will be described in which the higher order group signal is an STS-3 signal having a nominal repetitive frequency of 155.52 Mb/s and three STS-1 signals are multiplexed therein. At least one of the three STS-1 signals accommodates a DS3 signal. When N=16, 44.736 MHz/16=2,796 MHz and 155.53 MHz/2.796=55.62. Therefore, M1≦55 and M2≧56 are calculated. If the multiplexing degree on the higher order group signal is n, n=3. The largest of multiples of 3 not greater than 55 is 54=3*18. The smallest of the multiples of 3 not smaller than 56 is 57=3*19. Accordingly, as M1=54 and M2=57, the variable frequency dividing circuit 5 shown in FIG. 15 can carry out the frequency division by 18 and by 19.

Figure 15:
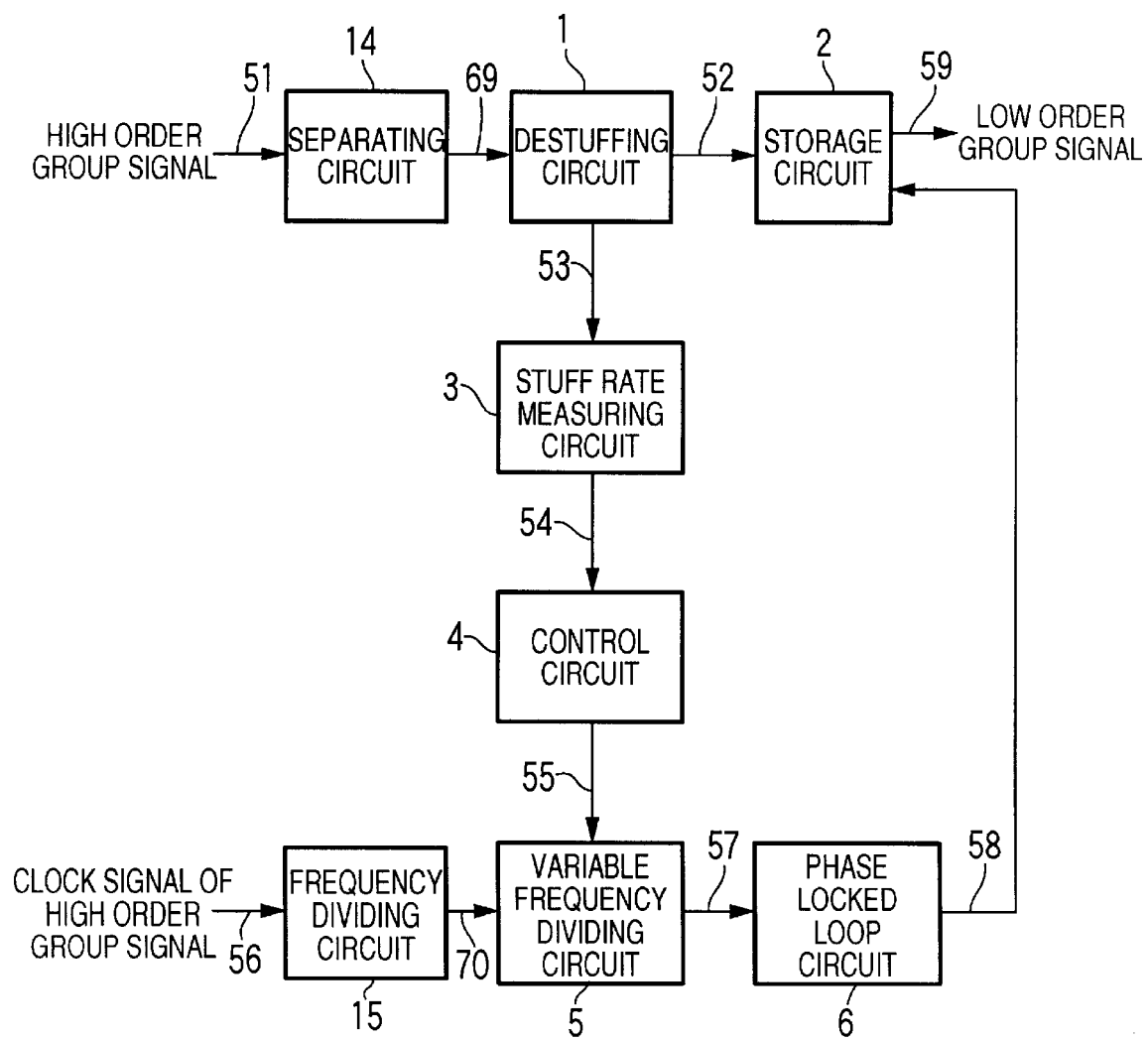
FIG. 15 is a block diagram showing the structure of the clock signal reproducing circuit according to the sixth embodiment of the present invention.
Figure 16:
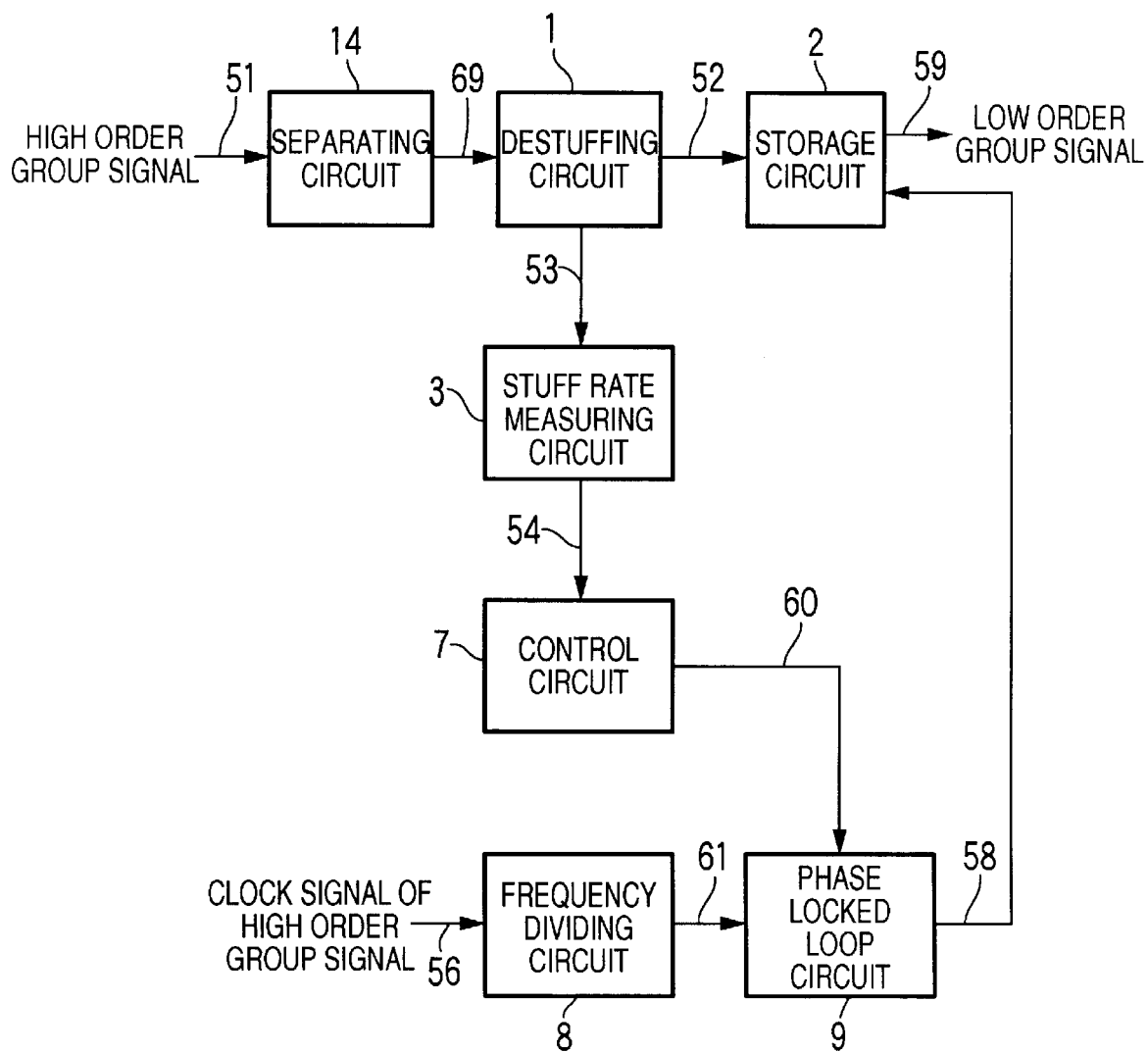
FIG. 16 is a block diagram showing the structure of the clock signal reproducing circuit according to the seventh embodiment of the present invention.

In case that n=2, the largest of multiples of 2 not greater than 55 is 54=2*27 and the smallest of the multiples of 2 not smaller than 56 is 56=2*28. Accordingly, as M1=54 and M2=56, the variable frequency dividing circuit 5 shown in FIG. 15 can carry out the frequency division by 27 and by 28. If n=1 or the frequency dividing circuit 15 shown in FIG. 15 is unused, M1=55 and M2=56 are selected and the variable frequency dividing circuit 5 shown in FIG. 15 can carry out the frequency division by 55 and by 56. Assuming that the frequency division ratios of the variable frequency dividing circuit 5 shown in FIG. 15 are 16 and 17 at n=3, 155.52 MHz/(3*16)=3.24 MHz and 155.52 MHz/(3*17)=

3.09 MHz are calculated. Accordingly, the frequency of the clock signal 57 outputted from the variable frequency dividing circuit 5 shown in FIG. 15 falls within a range from 3.09 MHz to 3.24 MHz. Hence, when N=14 is given, the frequency of the divided-by-N clock signal for the lower order group signal stays within the range.

If M1=55 and M2=56, a natural number N can not be selected for n=2 or N=1. In that case, the fourth embodiment of the present invention may be applicable. Similarly, when a plurality of lower order group signals are multiplexed in the higher frequency of the clock signal for the lower order group signal. Thus, the clock signal having the determined frequency can be directly reproduced. In particular, as the measurement of the stuff rate is improved, the accuracy of the clock signal can be increased.

Also, according to the present invention, the reproduced clock signal is prevented from having phase noises intrinsic to the voltage controlled oscillator circuit. This is because the frequency division ratio of the phase synchronization oscillator circuit can relatively be smaller. The reason is that the frequency division ratios of a frequency dividing circuit or a phase synchronization oscillator circuit can be equivalently set to any value other than natural numerals Further, according to the present invention, the clock signal reproducing circuit is comparatively reduced in the circuit structure.

The reason is that the overhead delete data employed commonly in any conventional technique is not used but the stuff rate is measured and used for reproducing the clock signal for the lower order group signal.

It would be apparent that the present invention is not limited to the foregoing embodiments but various changes and modifications may be made without departing from the scope of the present invention.

What is claimed is:

1. A clock signal reproducing circuit in a pulse stuffed synchronizing system which reproduces a lower order group signal from a higher order group signal, comprising:

a destuffing circuit removing stuff pulses and unnecessary bits from said higher order group signal to output said lower order group signal, and outputting stuff data indicating existence or non-existence of positive stuff or negative stuff in said higher order group signal, said lower order group signal being accommodated in said higher order group signal by inserting said stuff pulses in said lower order group signal;

a storage circuit storing said lower order group signal outputted from said destuffing circuit;

a stuff rate determining circuit determining a stuff rate from a difference between the number of positive stuffs and the number of negative stuffs to a stuffing possible period of said higher order group signal based on said stuff data outputted from said destuffing circuit;

a control circuit outputting a control signal indicating a frequency division ratio based on said stuff rate;

a variable frequency divider frequency dividing a clock signal of said higher order group signal based on said control signal outputted from said control circuit; and a phase synchronization oscillation circuit reproducing a clock signal of said lower order group signal based on said frequency-divided clock signal outputted from said variable frequency divider, said lower order group signal being read out from said storage circuit in response to said reproduced clock signal of said lower order group signal.

2. A clock signal reproducing circuit according to claim 1, wherein said phase synchronization oscillation circuit multiplies a frequency of said frequency-divided clock signal outputted from said variable frequency divider by N (N is a predetermined positive integer) to reproduce said clock signal of said lower order group signal, when a frequency division ratio of said phase synchronization oscillation circuit is N.

3. A clock signal reproducing circuit according to claim 1, further comprising:

a separating circuit separating a specific lower order group signal accommodated in said higher order group signal; and an additional frequency divider frequency-dividing said clock signal of said higher order group signal, and wherein said separated lower order group signal outputted from said separating circuit is supplied to said de-stuffing circuit, and the frequency-divided clock signal from said additional variable frequency divider is supplied to said variable frequency divider.

4. A clock signal reproducing circuit according to claim 1, further comprising:

a separating circuit separating a specific lower order group signal accommodated in said higher order group signal, and wherein said separated lower order group signal outputted from said separating circuit is supplied to said destuffing circuit.

5. A clock signal reproducing circuit according to claim 1, wherein said control circuit includes:

a calculating circuit which carries out a calculation based on said stuff rate;

a summing circuit summing an output of said calculating circuit for every frequency division period; and a determining circuit determining whether or not an output of the summing circuit is equal to or larger than a predetermined value.

6. A clock signal reproducing circuit according to claim 1, wherein said stuff rate determining circuit includes:

a shift register circuit which stores said stuff data in order;

a summation calculating circuit which calculates a summation of input data and an output of said shift register circuit; and a multiplying circuit which multiplies an output of said summation calculating circuit by a predetermined value.

7. A clock signal reproducing circuit according to claim 1, wherein said storage circuit includes:

a storage element which stores a signal;

a write address counter which is driven in response to a write clock signal, and generates a write address to specify a position of said storage element in which an input signal is written;

a read address counter which is driven in response to a read clock signal and generates a read address to specify a position of said storage element from which an output signal is read out; and an address control circuit which prevents a writing operation and a reading operation to a same position of said storage element from being carried out at a same time.

8. A clock signal reproducing circuit according to claim 7, wherein said address control circuit controls at least one of said write address counter and said read address counter such that said write address and said read address are apart from each other, when said write address and said read address becomes near to a limit.

9. A clock signal reproducing circuit according to claim 7, wherein said address control circuit controls at least one of said write address counter and said read address counter such that said write address and said read address are apart from each other at an initial setting.

10. A clock signal reproducing circuit of a pulse stuffed synchronizing system which reproduces a lower order group signal from a higher order group signal, comprising:

a destuffing circuit removing stuff pulses and unnecessary bits from said higher order group signal to output said lower order group signal, and outputting stuff data indicating existence or non-existence of positive stuff or negative stuff in said higher order group signal, said lower order group signal being accommodated in said higher order group signal by inserting said stuff pulses in said lower order group signal;

a storage circuit storing said lower order group signal outputted from said destuffing circuit;

a stuff rate determining circuit determining a stuff rate from a difference between the number of positive stuffs and the number of negative stuffs to a stuffing possible period of said higher order group signal based on said stuff data outputted from said destuffing circuit;

a control circuit outputting a control signal indicating a division ratio based on said stuff rate;

a frequency divider frequency dividing a clock signal of said higher order group signal in a predetermined frequency division ratio;

a phase synchronization oscillation circuit frequency-dividing said frequency-divided clock signal outputted from said variable frequency divider based on said control signal outputted from said control circuit, to reproduce a clock signal of said lower order group signal, said lower order group signal being read out from said storage circuit in response to said reproduced clock signal of said lower order group signal.

11. A clock signal reproducing circuit according to claim 10, wherein said phase synchronization oscillation circuit multiplies a frequency of said frequency-divided clock signal outputted from said variable frequency divider by N (N is a positive number) based on said control signal outputted from said control circuit to reproduce said clock signal of said lower order group signal, when an average frequency division ratio of said phase synchronization oscillation circuit is N.

12. A clock signal reproducing circuit according to claim 10, further comprising:

a separating circuit separating a specific lower order group signal accommodated in said higher order group signal; and an additional frequency divider frequency-dividing said clock signal of said higher order group signal, and wherein said separated lower order group signal outputted from said separating circuit is supplied to said destuffing circuit, and the frequency-divided clock signal from said additional variable frequency divider is supplied to said variable frequency divider.

13. A clock signal reproducing circuit according to claim 10, further comprising:

a separating circuit separating a specific lower order group signal accommodated in said higher order group signal, and wherein said separated lower order group signal outputted from said separating circuit is supplied to said destuffing circuit.

14. A clock signal reproducing circuit according to claim 10, wherein said stuff rate determining circuit includes:

a shift register circuit which stores said stuff data in order;

a summation calculating circuit which calculates a summation of input data and an output of said shift register circuit; and a multiplying circuit which multiplies an output of said summation calculating circuit by a predetermined value.

15. A clock signal reproducing circuit according to claim 10, wherein said control circuit includes:

a calculating circuit which carries out calculation based on said stuff rate;

a summing circuit summing an output of said calculating circuit for every frequency division period; and a determining circuit determining whether or not an output of the summing circuit is equal to or larger than a predetermined value.

16. A clock signal reproducing circuit according to claim 10, wherein said storage circuit includes:

a storage element which stores a signal;

a write address counter which is driven in response to a write clock signal, and generates a write address to specify a position of said storage element in which an input signal is written;

a read address counter which is driven in response to a read clock signal and generates a read address to specify a position of said storage element from which an output signal is read out; and an address control circuit which prevents a writing operation and a reading operation to a same position of said storage element from being carried out at a same time.

17. A clock signal reproducing circuit according to claim 16, wherein said address control circuit controls at least one of said write address counter and said read address counter such that said write address and said read address are apart from each other, when said write address and said read address becomes near to a limit.

18. A clock signal reproducing circuit according to claim 16, wherein said address control circuit controls at least one of said write address counter and said read address counter such that said write address and said read address are apart from each other at an initial setting.

19. A clock signal reproducing circuit of a pulse stuffed synchronizing system which reproduces a lower order group signal from a higher order group signal, comprising:

a destuffing circuit removing stuff pulses and unnecessary bits from said higher order group signal to output said lower order group signal, and outputting stuff data indicating existence or non existence of positive stuff or negative stuff in said higher order group signal, said lower order group signal being accommodated in said higher order group signal by inserting said stuff pulses in said lower order group signal in a transmitting side;

a storage circuit storing said lower order group signal outputted from said destuffing circuit;

a stuff rate determining circuit determining a stuff rate from a difference between the number of positive stuffs and the number of negative stuffs to a stuffing possible period of said higher order group signal based on said stuff data outputted from said destuffing circuit;

a first control circuit outputting a first control signal indicating a first frequency division ratio based on said stuff rate;

a second control circuit outputting a second control signal indicating a predetermined second frequency division ratio;

a variable frequency divider dividing a clock signal of said higher order group signal based on said first control signal from said first control circuit; and a phase synchronization oscillation circuit frequency-dividing said frequency-divided clock signal outputted from said variable frequency divider based on said second control signal outputted from said second control circuit, to reproduce a clock signal of said lower order group signal, said lower order group signal being read out from said storage circuit in response to said reproduced clock signal of said lower order group signal.

20. A clock signal reproducing circuit according to claim 19, wherein said phase synchronization oscillation circuit multiplies a frequency of said frequency-divided clock signal outputted from said variable frequency divider by N (N is a positive number) based on said second control signal outputted from said second control circuit to reproduce said clock signal of said lower order group signal, when an average frequency division ratio of said phase synchronization oscillation circuit is N.

21. A clock signal reproducing circuit according to claim 19, further comprising:

a separating circuit separating a specific lower order group signal accommodated in said higher order group signal; and an additional frequency divider frequency-dividing said clock signal of said higher order group signal, and wherein said separated lower order group signal outputted from said separating circuit is supplied to said destuffing circuit, and the frequency-divided clock signal from said additional variable frequency divider is supplied to said variable frequency divider.

22. A clock signal reproducing circuit according to claim 19, further comprising:

a separating circuit separating a specific lower order group signal accommodated in said higher order group signal, and wherein said separated lower order group signal outputted from said separating circuit is supplied to said destuffing circuit.

23. A clock signal reproducing circuit according to claim 19, wherein said first control circuit includes:

a calculating circuit which carries out calculation based on said stuff rate;

a summing circuit summing an output of said calculating circuit for every frequency division period; and a determining circuit determining whether or not an output of the summing circuit is equal to or larger than a predetermined value.

24. A clock signal reproducing circuit according to claim 19, wherein said stuff rate determining circuit includes:

a shift register circuit which stores said stuff data in order;

a summation calculating circuit which calculates a summation of input data and an output of said shift register circuit; and a multiplying circuit which multiplies an output of said summation calculating circuit by a predetermined value.

25. A clock signal reproducing circuit according to claim 19, wherein said storage circuit includes:

a storage element which stores a signal;

a write address counter which is driven in response to a write clock signal, and generates a write address to specify a position of said storage element in which an input signal is written;

a read address counter which is driven in response to a read clock signal and generates a read address to specify a position of said storage element from which an output signal is read out; and an address control circuit which prevents a writing operation and a reading operation to a same position of said storage element from being carried out at a same time.

26. A clock signal reproducing circuit according to claim 25, wherein said address control circuit controls at least one of said write address counter and said read address counter such that said write address and said read address are apart from each other, when said write address and said read address becomes near to a limit.

27. A clock signal reproducing circuit according to claim 25, wherein said address control circuit controls at least one of said write address counter and said read address counter such that said write address and said read address are apart from each other at an initial setting.

28. A clock signal reproducing circuit of a pulse stuffing synchronizing system which reproduces a lower order group signal from a higher order group signal, comprising:

a destuffing circuit removing stuff pulses and unnecessary bits from said higher order group signal to output said lower order group signal, and outputting stuff data indicating existence or non existence of positive stuff or negative stuff in said higher order group signal, said lower order group signal being accommodated in said higher order group signal by inserting said stuff pulses in said lower order group signal in a transmitting side;

a storage circuit storing said lower order group signal outputted from said destuffing circuit;

a stuff rate determining circuit determining a stuff rate from a difference between the number of positive stuffs and the number of negative stuffs to a stuffing possible period of said higher order group signal based on said stuff data outputted from said destuffing circuit;

a first control circuit outputting a first control signal indicating a predetermined first frequency division ratio;

a second control circuit outputting a second control signal indicating a second frequency division ratio based on said stuff rate;

a variable frequency divider frequency-dividing a clock signal of said higher order group signal based on said first control signal from said first control circuit; and a phase synchronization oscillation circuit frequency-dividing said frequency-divided clock signal outputted from said variable frequency divider based on said second control signal outputted from said second control circuit, to reproduce a clock signal of said lower order group signal, said lower order group signal being read out from said storage circuit in response to said reproduced clock signal of said lower order group signal.

29. A clock signal reproducing circuit according to claim 28, wherein said phase synchronization oscillation circuit multiplies a frequency of said frequency-divided clock signal outputted from said variable frequency divider by N (N is a positive number) based on said second control signal outputted from said second control circuit to reproduce said clock signal of said lower order group signal, when an average frequency division ratio of said phase synchronization oscillation circuit is N.

30. A clock signal reproducing circuit according to claim 28, further comprising:

a separating circuit separating a specific lower order group signal accommodated in said higher order group signal; and an additional frequency divider frequency-dividing said clock signal of said higher order group signal, and wherein said separated lower order group signal outputted from said separating circuit is supplied to said destuffing circuit, and the frequency-divided clock signal from said additional variable frequency divider is supplied to said variable frequency divider.

31. A clock signal reproducing circuit according to claim 28, further comprising:

a separating circuit separating a specific lower order group signal accommodated in said higher order group signal, and wherein said separated lower order group signal outputted from said separating circuit is supplied to said destuffing circuit.

32. A clock signal reproducing circuit according to claim 28, wherein said second control circuit includes:

a calculating circuit which carries out calculation based on said stuff rate;

a summing circuit summing an output of said calculating circuit for every frequency division period; and a determining circuit determining whether or not an output of the summing circuit is equal to or larger than a predetermined value.

33. A clock signal reproducing circuit according to claim 28, wherein said stuff rate determining circuit includes:

a shift register circuit which stores said stuff data in order;

a summation calculating circuit which calculates a summation of input data and an output of said shift register circuit; and a multiplying circuit which multiplies an output of said summation calculating circuit by a predetermined value.

34. A clock signal reproducing circuit according to claim 28, wherein said storage circuit includes:

a storage element which stores a signal;

a write address counter which is driven in response to a write clock signal, and generates a write address to specify a position of said storage element in which an input signal is written;

a read address counter which is driven in response to a read clock signal and generates a read address to specify a position of said storage element from which an output signal is read out; and an address control circuit which prevents a writing operation and a reading operation to a same position of said storage element from being carried out at a same time.

35. A clock signal reproducing circuit according to claim 34, wherein said address control circuit controls at least one of said write address counter and said read address counter such that said write address and said read address are apart from each other, when said write address and said read address becomes near to a limit.

36. A clock signal reproducing circuit according to claim 34, wherein said address control circuit controls at least one of said write address counter and said read address counter such that said write address and said read address are apart from each other at an initial setting.

* * * * *